United States Patent
Li et al.

(10) Patent No.: US 12,507,502 B2
(45) Date of Patent: Dec. 23, 2025

(54) SOLAR CELL AND METHOD FOR PREPARING THE SAME, TANDEM SOLAR CELL, AND PHOTOVOLTAIC MODULE

(71) Applicant: ZHEJIANG JINKO SOLAR CO., LTD., Zhejiang (CN)

(72) Inventors: Huimin Li, Zhejiang (CN); Menglei Xu, Zhejiang (CN); Jie Yang, Zhejiang (CN); Xinyu Zhang, Zhejiang (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 18/626,279

(22) Filed: Apr. 3, 2024

(65) Prior Publication Data

US 2025/0255035 A1    Aug. 7, 2025

(30) Foreign Application Priority Data

Feb. 6, 2024   (CN) .......................... 202410171684.5

(51) Int. Cl.
*H10F 77/70*     (2025.01)
*H10F 77/30*     (2025.01)
*H10F 19/80*     (2025.01)

(52) U.S. Cl.
CPC ......... *H10F 77/703* (2025.01); *H10F 77/311* (2025.01); *H10F 19/80* (2025.01)

(58) Field of Classification Search
CPC .............................. H10F 77/703; H10F 77/311
See application file for complete search history.

(56) References Cited

U.S. PATENT DOCUMENTS

2009/0260681 A1* 10/2009 Yun ........................ H10F 71/121
                                                                    257/E31.127
2014/0130857 A1*  5/2014 Narita .................... H10F 77/215
                                                                                 438/72

(Continued)

FOREIGN PATENT DOCUMENTS

CN           101933156 A          12/2010
CN           103021840 A           4/2013

(Continued)

OTHER PUBLICATIONS

Zhou et al., CN 117476801 A, English Machine Translation. (Year: 2024).*

(Continued)

*Primary Examiner* — Tae-Sik Kang
(74) *Attorney, Agent, or Firm* — USCH Law, PC

(57) ABSTRACT

Disclosed are a solar cell, a tandem solar cell, and a photovoltaic module. The solar cell includes a substrate, a doped semiconductor layer, a passivation layer and a plurality of electrodes. The substrate is provided with textured structures on a portion of a surface of the substrate. The doped semiconductor layer is disposed on the substrate. The solar cell further includes holes extending through the doped semiconductor layer, and corresponding to the textured structures, respectively, and a bottom of a respective hole exposes at least a portion of a corresponding textured structure. The passivation layer is formed over a surface of the doped semiconductor layer away from the substrate, fills the holes. The plurality of electrodes are arranged along a first direction, pass through the passivation layer and are in electrical contact with the doped semiconductor layer.

19 Claims, 10 Drawing Sheets

(56) References Cited

U.S. PATENT DOCUMENTS

| | | | |
|---|---|---|---|
| 2015/0162483 A1 | 6/2015 | Weidman et al. | |
| 2015/0162484 A1 | 6/2015 | Weidman | |
| 2015/0280029 A1 | 10/2015 | Harley et al. | |
| 2017/0179310 A1 | 6/2017 | Westerberg et al. | |
| 2018/0182905 A1 | 6/2018 | Nam et al. | |
| 2022/0013487 A1 | 1/2022 | Kim | |
| 2023/0041537 A1* | 2/2023 | Huang | H10F 77/484 |
| 2023/0143714 A1 | 5/2023 | Xu et al. | |
| 2023/0327036 A1* | 10/2023 | Kuo | H10F 71/00 |
| 2023/0345743 A1* | 10/2023 | Gotanda | H10K 30/211 |

FOREIGN PATENT DOCUMENTS

| | | |
|---|---|---|
| CN | 102388465 B | 11/2014 |
| CN | 110212048 A | 9/2019 |
| CN | 111133590 A | 5/2020 |
| CN | 210897302 U | 6/2020 |
| CN | 214043686 U | 8/2021 |
| CN | 114242803 A | 3/2022 |
| CN | 115148839 A | 10/2022 |
| CN | 115241298 A | 10/2022 |
| CN | 115458617 A | 12/2022 |
| CN | 115985980 A | 4/2023 |
| CN | 218827154 U | 4/2023 |
| CN | 116314383 A | 6/2023 |
| CN | 116864551 A | 10/2023 |
| CN | 116913989 A | 10/2023 |
| CN | 117219687 A | 12/2023 |
| CN | 117276361 A | 12/2023 |
| CN | 117352567 A | 1/2024 |
| CN | 117476801 A * | 1/2024 |
| CN | 117497626 A | 2/2024 |
| JP | 2014220426 A | 11/2014 |
| JP | 2015015472 A | 1/2015 |
| JP | 2015514314 A | 5/2015 |
| JP | 2018056454 A | 4/2018 |
| JP | 2021132233 A | 9/2021 |
| JP | 2023155863 A | 10/2023 |
| JP | 2023155871 A | 10/2023 |
| JP | 2023164954 A | 11/2023 |
| WO | 2008052144 A2 | 5/2008 |
| WO | 2008078771 A1 | 7/2008 |
| WO | 2010021235 A1 | 2/2010 |
| WO | 2014192408 A1 | 12/2014 |
| WO | 2020196288 A1 | 10/2020 |

OTHER PUBLICATIONS

Zhejiang Jinko Solar Co., Ltd. et al., AU First Office Action, AU2024202221, Jan. 31, 2025, 10 pgs.

Zhejiang Jinko Solar Co., Ltd., CN First Office Action with English translation, CN 2024101726160, Mar. 27, 2024, 15 pgs.

Zhejiang Jinko Solar Co., Ltd., Notification to Grant Patent Right for Invention with English translation, CN 2024101726160, Apr. 15, 2024, 6 pgs.

Zhejiang Jinko Solar Co., Ltd., Extended European Search Report, EP 24168513.0, Sep. 20, 2024, 30 pgs.

Zhejiang Jinko Solar Co., Ltd., Extended European Search Report, EP 24169780.4, Oct. 23. 2024, 11 pgs.

* cited by examiner

SOLAR CELL AND METHOD FOR PREPARING THE SAME, TANDEM SOLAR CELL, AND PHOTOVOLTAIC MODULE

CROSS REFERENCE TO RELATED APPLICATIONS

The present application claims the benefit of priority under the Paris Convention to Chinese Patent Application No. 202410171684.5 filed on Feb. 6, 2024, which is incorporated herein by reference in its entirety.

TECHNICAL FIELD

Embodiments of the present disclosure relate to the field of photovoltaics and, in particular, to a solar cell and a method of preparing the same, a tandem solar cell and a photovoltaic module.

BACKGROUND

At present, as fossil fuels are gradually exhausted, solar cells have wider applications as a new energy alternative solution. A solar cell is an apparatus that converts light energy of the sun into electric energy. The solar cell generates carriers by using a photovoltaic effect principle and introduces the carriers out by using an electrode, which is conducive to effective utilization of the electric energy.

A Tunnel Oxide Passivated Contact (hereinafter TOPCon) cell or A TOPCon-BC (hereinafter TBC) cell constituted by combining TOPCon technology with interdigitated back contact (hereinafter IBC) technology are required to prepare a passivation contact structure on a surface of a silicon substrate. For example, an ultrathin tunneling oxide layer and a highly doped polysilicon layer may be used as the passivation contact structure, a chemical passivation of the tunneling oxide layer and a field passivation of the polysilicon layer may be utilized to significantly reduce a recombination rate of minority carriers of the surface of the silicon substrate, meanwhile the highly doped polysilicon layer can significantly improve an electric conductivity property of majority carriers, which are advantageous to increase an open circuit voltage and a fill factor of the cell.

Chemical Vapor Deposition (CVD) is a major technology for preparation of the tunneling oxide layer and the polysilicon layer, for example, Low Pressure Chemical Vapor Deposition (LPCVD) has advantages of low cost, high yield, and high performance of the produced thin films, and has been widely used. However, there may be some problems in the process of preparing a back contact passivation structure, which may affect an efficiency of the cell.

SUMMARY

In accordance with some embodiments of the present disclosure, in one aspect, a solar cell is provided, and includes a substrate, a doped semiconductor layer, a passivation layer and a plurality of electrodes. The substrate is provided with textured structures on a portion of a surface of the substrate. The doped semiconductor layer is disposed on the substrate. The solar cell further includes holes extending through the doped semiconductor layer, and correspond to the textured structures, respectively, and a bottom of a respective hole of the holes exposes at least a portion of a corresponding textured structure of the textured structures. The passivation layer is formed over a surface of the doped semiconductor layer away from the substrate, fills the holes. The plurality of electrodes are arranged at intervals along a first direction, pass through the passivation layer and are in electrical contact with the doped semiconductor layer.

In some embodiments, the textured structures include at least one raised structure, and the respective hole corresponds to 1 to 5 raised structures in the at least one raised structure.

In some embodiments, the substrate includes a first surface and a second surface opposite to the first surface. The substrate is provided with a pyramidal structure on the first surface, and the pyramidal structure includes a plurality of pyramids. The substrate is provided with the textured structures on a portion of the second surface, and a one-dimensional size of a respective raised structure of the at least one raised structure is less than or equal to a one-dimensional size of a respective pyramid of the plurality of pyramids.

In some embodiments, the respective raised structure has a one-dimensional size in a range of 1 μm to 20 μm and a height in a range of 1 μm to 20 μm.

In some embodiments, the substrate is further provided with a truncated pyramid structure on another portion of the second surface, the truncated pyramid structure includes a plurality of truncated pyramids, and a respective truncated pyramid of a portion of the plurality of truncated pyramids is overlapped with a truncated pyramid adjacent to the respective truncated pyramid.

In some embodiments, the respective hole has a one-dimensional size ranging from 5 μm to 20 μm.

In some embodiments, the substrate is provided with recesses, the recesses correspond, respectively, to the holes, the textured structures are arranged in the recesses.

In some embodiments, a respective recess of the recesses has a depth in a range of 0.1 μm to 4 μm.

In some embodiments, the doped semiconductor layer includes at least one of a doped amorphous silicon layer, a doped polycrystalline silicon layer, a doped microcrystalline silicon layer, a doped silicon carbide layer, and a doped crystalline silicon layer.

In some embodiments, the doped semiconductor layer has a boundary, a number of the holes near the boundary is greater than a number of the holes away from the boundary.

In some embodiments, the solar cell further includes a dielectric layer between the substrate and the doped semiconductor layer, and the holes further extends through the dielectric layer.

In some embodiments, a portion of the plurality of electrodes are arranged in the holes to cover the textured structures.

In some embodiments, the substrate is provided with P regions, N regions and gap regions on the second surface, the P regions and the N regions are arranged alternatingly, a respective gap region of the gap regions is sandwiched between a respective P region of the P regions and a N region adjacent to the respective P region in the N regions. The doped semiconductor layer includes a first portion arranged at the P regions and a second portion arranged at the N regions. The plurality of electrodes include first electrodes in electrical contact with the first portion of the doped semiconductor layer and second electrodes in electrical contact with the second portion of the doped semiconductor layer. The passivation layer further covers a surface of the substrate at the gap regions. A portion of the holes is arranged at the first portion of the doped semiconductor layer, and/or another portion of the holes is arranged at the second portion of the doped semiconductor layer.

In accordance with some embodiments of the present disclosure, in yet another aspect, a tandem solar cell is provided and includes: a bottom cell being a solar cell according to any of the above embodiments or prepared by the method according to the above embodiments; and a top cell arranged on a side of the substrate of the bottom cell away from the plurality of electrodes.

According to some embodiments of the present disclosure, in still another aspect, a photovoltaic module is provided and includes: at least one cell string formed by connecting a plurality of solar cells according to any one of the above embodiments, the plurality of solar cells prepared by the method according to any of the above embodiments, or the plurality of tandem solar cells according to the above embodiments; at least one encapsulation film form over surfaces of the at least one cell string; at least one cover plate formed over surfaces of the at least one encapsulation film facing away from the at least one cell string.

BRIEF DESCRIPTION OF THE DRAWINGS

One or more embodiments are described by way of example with reference to the corresponding figures in the accompanying drawings, and the exemplary description is not to be construed as limiting the embodiments. Elements in the accompanying drawings that have same reference signs are represented as similar elements, and unless otherwise particularly stated, the figures in the accompanying drawings are not drawn to scale. To describe the technical solutions of the embodiments of the present disclosure or the related art more clearly, the accompanying drawings that need to be used in the embodiments are briefly described below. Apparently, the accompanying drawings in the following description show only some embodiments of the present disclosure, and a person of ordinary skill in the art may still derive other drawings from these accompanying drawings without creative efforts.

DETAILED DESCRIPTION OF THE EMBODIMENTS

It can be seen from the BACKGROUND that current solar cells have poor photoelectric conversion efficiency.

In a solar cell provided by embodiments of the present disclosure, a substrate is provided with textured structures on its surface, a doped semiconductor layer has first holes, the first holes correspond on a one-to-one basis with the textured structures, a bottom of a respective first hole of the first holes exposes the corresponding textured structure. The textured structures can improve internal reflection of the substrate, thereby reducing light loss of the solar cell. The first holes may also serve as light trapping structures, to enhance internal reflection of incident light within the doped semiconductor layer, and to improve a cell efficiency. The passivation layer fills the first holes, and may provide a second passivation to the substrate, so that the substrate can be passivated by the passivation layer and the doped semiconductor layer simultaneously, thereby reducing surface defects of the substrate, to improve photoelectric conversion efficiency of the solar cell.

Furthermore, the doped semiconductor layer has the first holes, the first holes correspond on a one-to-one basis with the textured structures, the passivation layer fills the first holes, the cooperation among the doped semiconductor layer, the passivation layer, the textured structures and the first holes makes the solar cell guarantee its passivation performance and some light trapping structures are provided on the surface of the substrate to increase an internal reflectivity, thereby increasing a short circuit current as well as an open circuit voltage and thus improving the cell efficiency.

Various embodiments of the present disclosure will now be described in detail with reference to the accompanying drawings. However, those of ordinary skill in the art should appreciate that, in various embodiments of the present disclosure, numerous technical details are set forth in order to provide the reader with a better understanding of the present disclosure. However, the claimed subject matter of the present disclosure can be implemented without these technical details and various variations and modifications based on the following embodiments.

Figure 1:
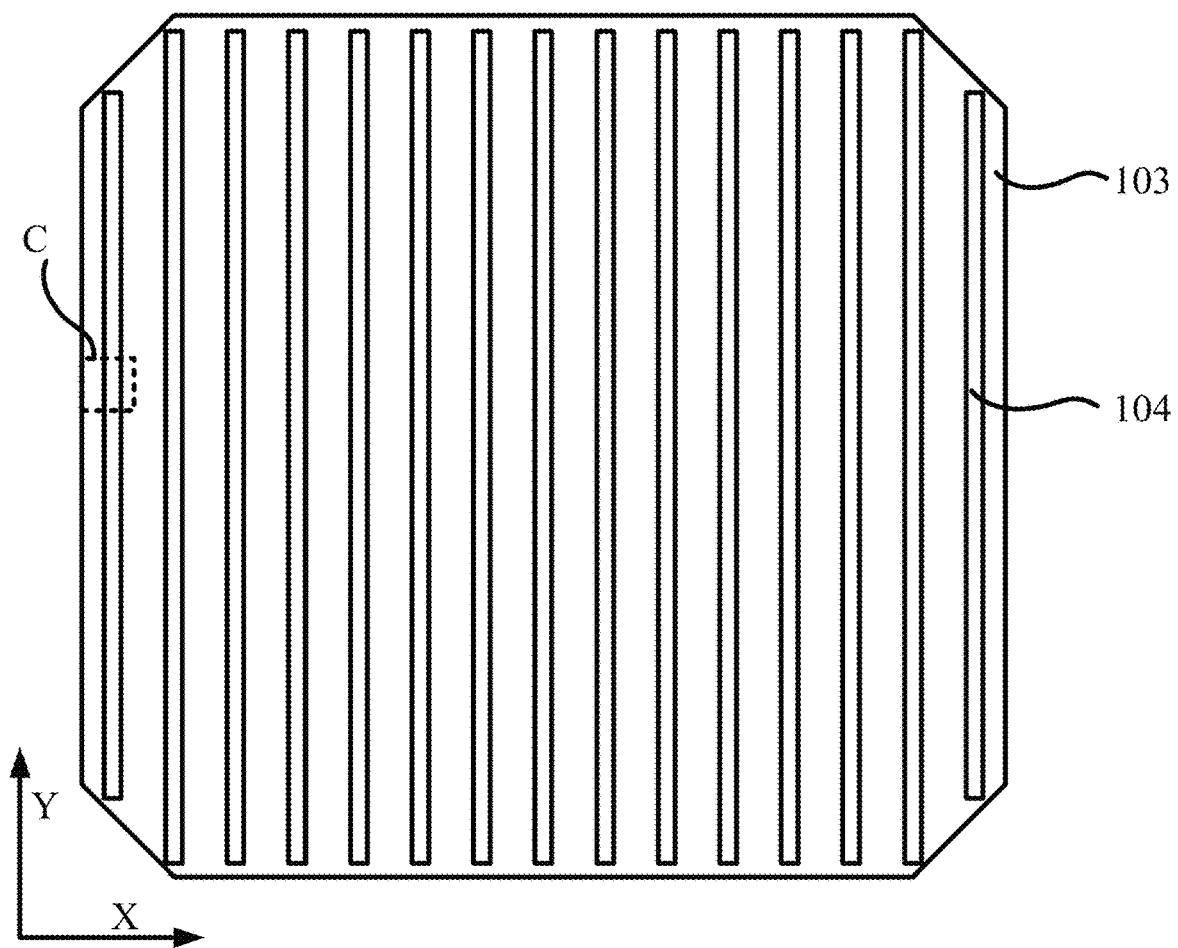
FIG. 1 is a schematic diagram illustrating a structure of a solar cell in accordance with an embodiment of the present disclosure.
Figure 2:
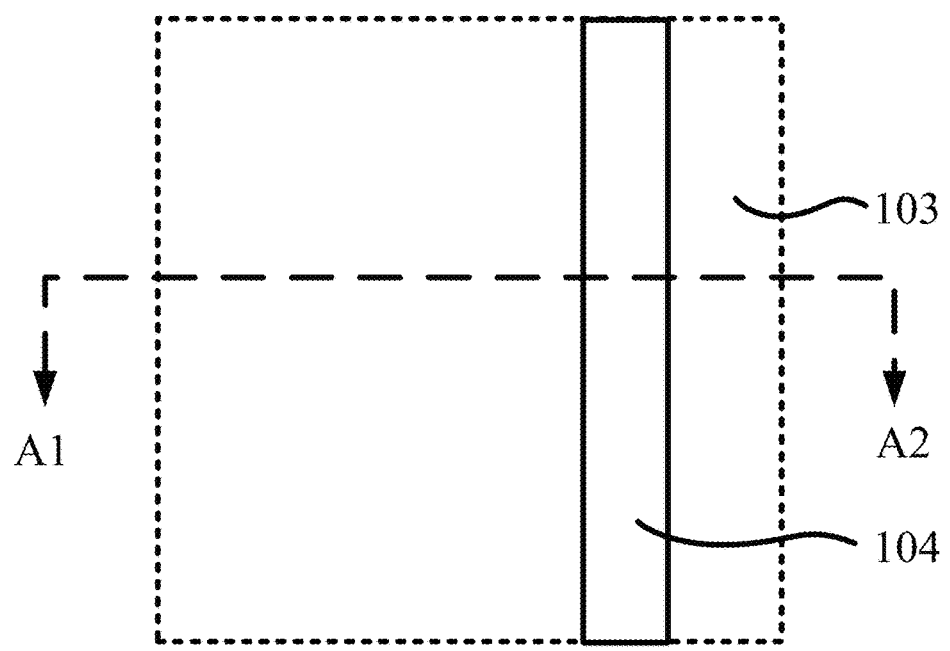
FIG. 2 is an enlarged partial view at C in FIG. 1.
Figure 3:
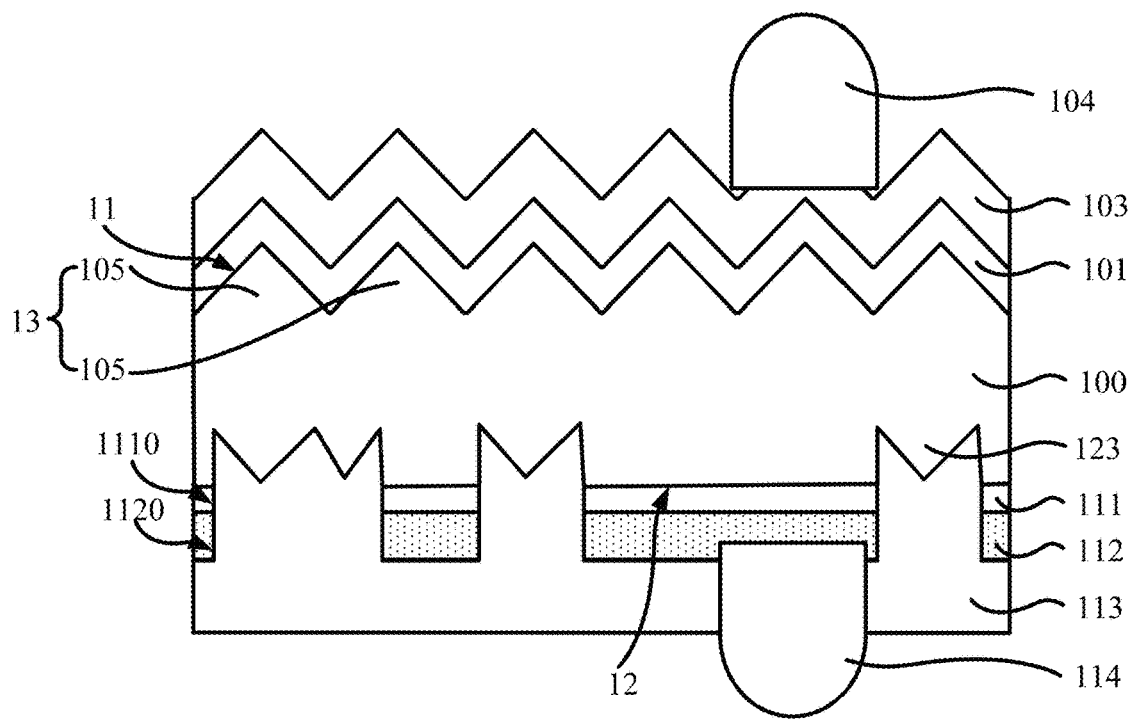
FIG. 3 is a schematic diagram illustrating a cross-sectional view taken along a line A1-A2 in FIG. 2.
Figure 4:
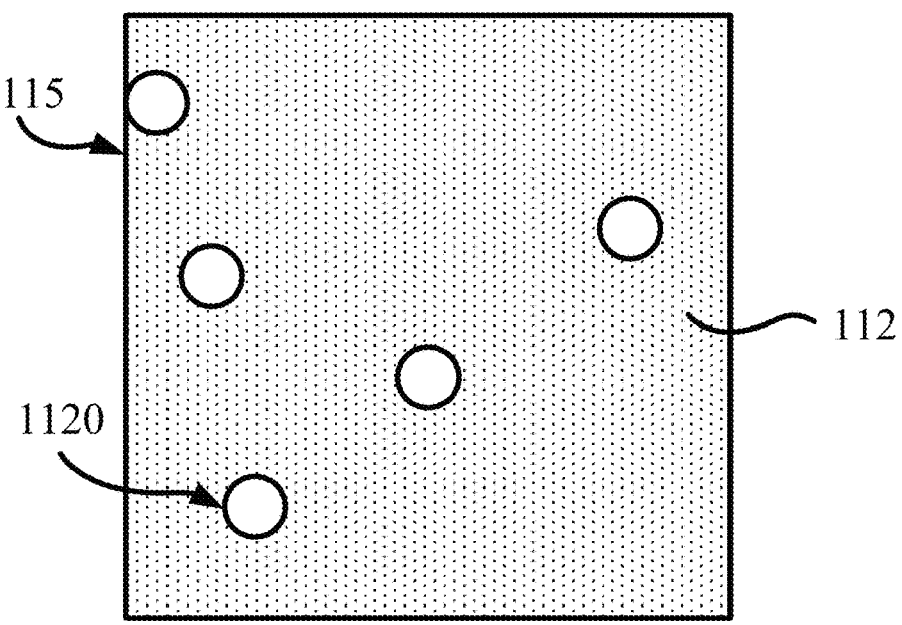
FIG. 4 is a schematic diagram illustrating a structure of a doped semiconductor layer in a solar cell in accordance with an embodiment of the present disclosure.
Figure 5:
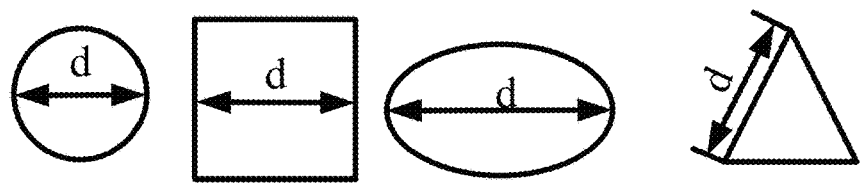
FIG. 5 is a schematic diagram showing various configuration examples of a first hole in a solar cell in accordance with an embodiment of the present disclosure.
Figure 6:
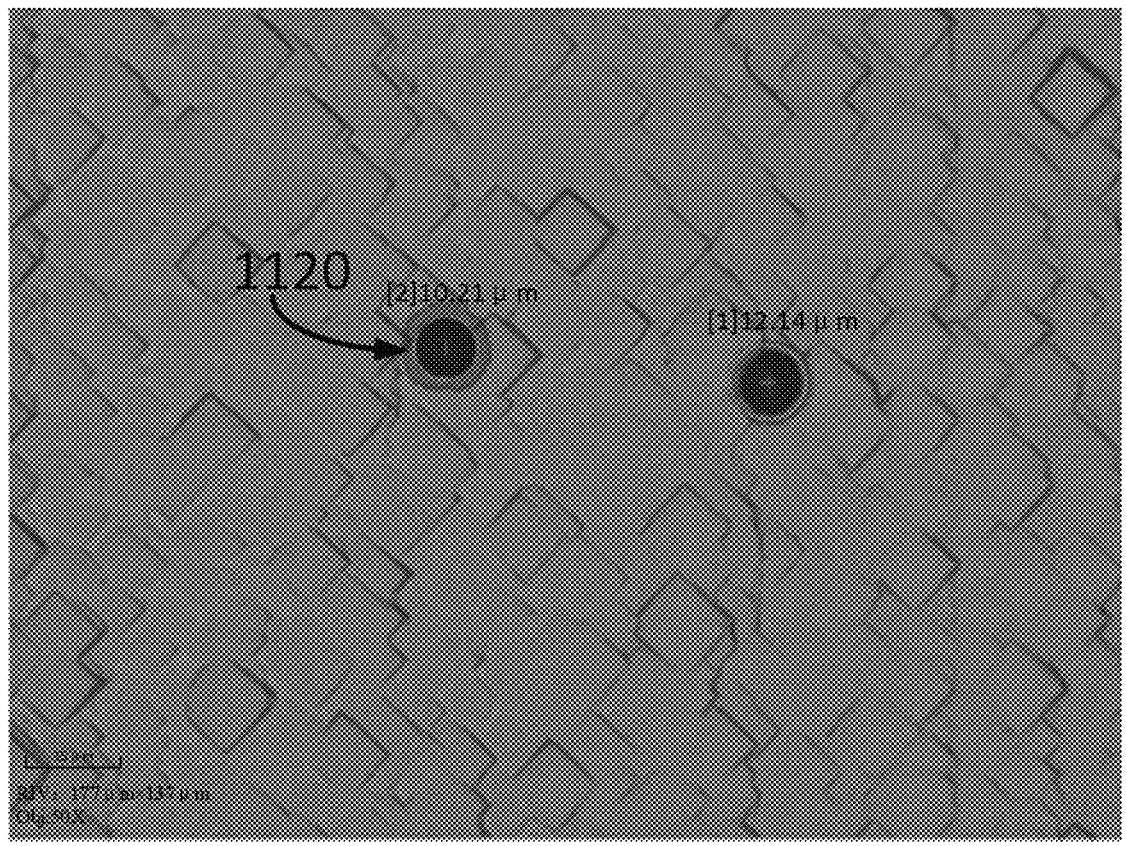
FIG. 6 is a schematic diagram illustrating a surface structure of a doped semiconductor layer in a solar cell in accordance with an embodiment of the present disclosure.
Figure 7:
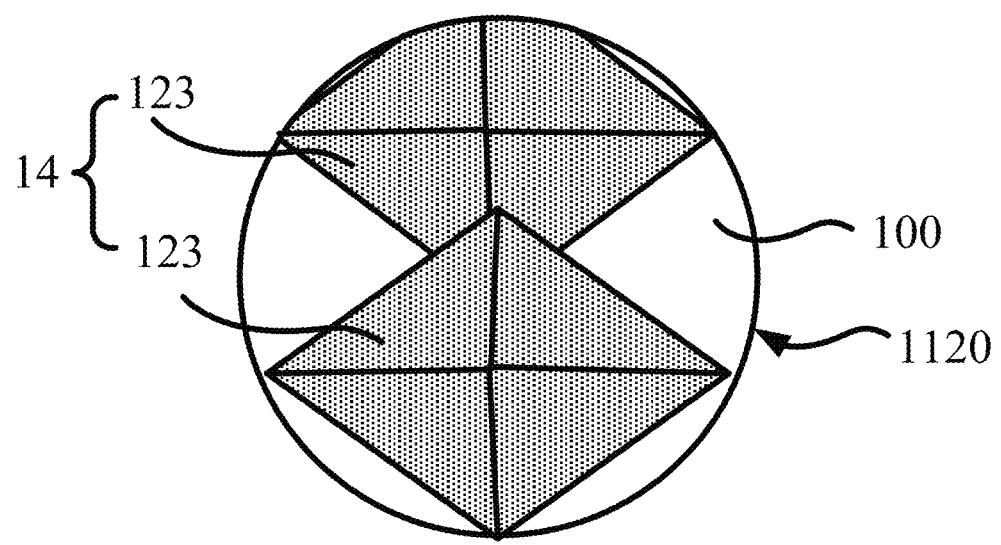
FIG. 7 is a schematic diagram illustrating a structure of a first hole in a solar cell in accordance with an embodiment of the present disclosure.
Figure 8:
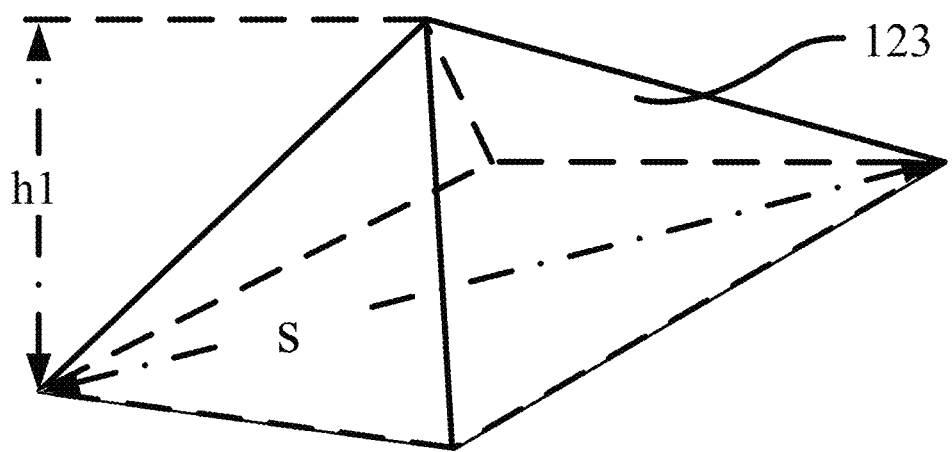
FIG. 8 is a schematic diagram illustrating a structure of a raised structure in a solar cell in accordance with an embodiment of the present disclosure.
Figure 9:
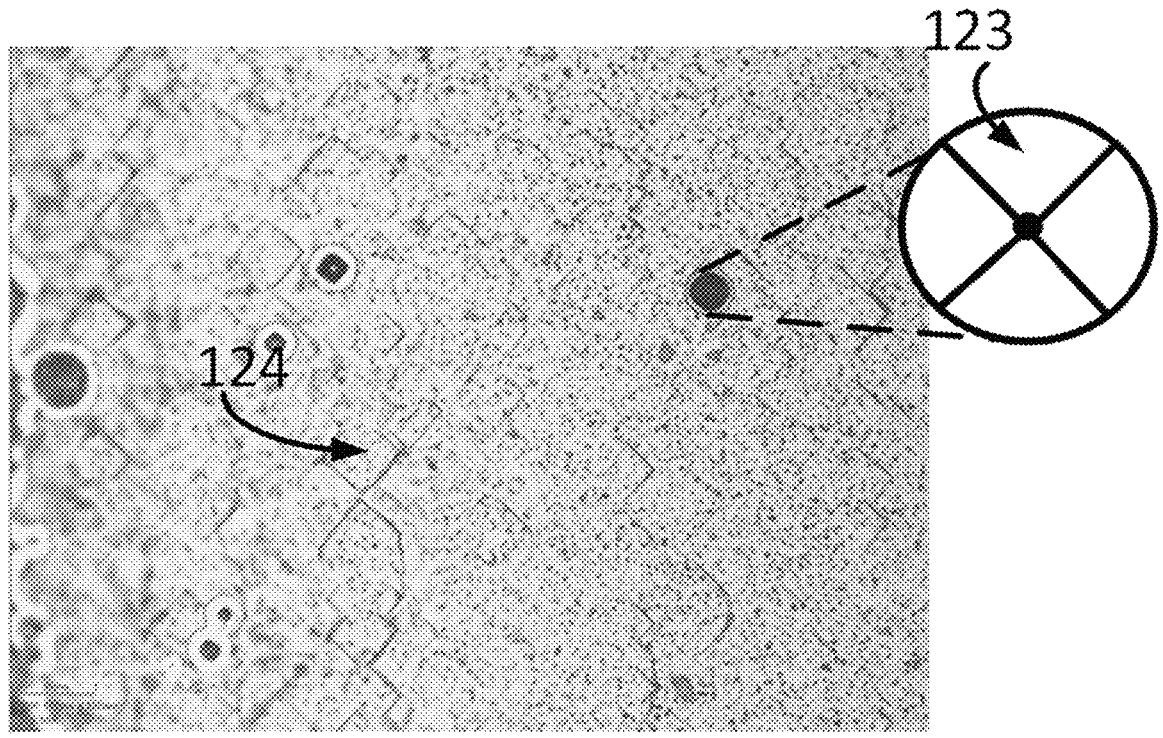
FIG. 9 is a schematic diagram illustrating a structure of a substrate in a solar cell in accordance with an embodiment of the present disclosure.

FIG. 1 is schematic diagram illustrating a structure of a solar cell in accordance with an embodiment of the present disclosure; FIG. 2 is an enlarged partial view at C in FIG. 1; FIG. 3 is a schematic diagram illustrating a cross-sectional view taken along a line A1-A2 in FIG. 2; FIG. 4 is a schematic diagram illustrating a structure of a doped semiconductor layer in a solar cell in accordance with an embodiment of the present disclosure; FIG. 5 are a schematic diagram showing various configuration examples of a first hole in a solar cell in accordance with an embodiment of the present disclosure; FIG. 6 is a schematic diagram illustrating a surface structure of a doped semiconductor layer in a solar cell in accordance with an embodiment of the present disclosure; FIG. 7 is a schematic diagram illustrating a structure of a first hole in a solar cell in accordance with an embodiment of the present disclosure; FIG. 8 is a schematic diagram illustrating a structure of a raised structure in a solar cell in accordance with an embodiment of the present disclosure; and FIG. 9 is a schematic diagram illustrating a structure of a substrate in a solar cell in accordance with an embodiment of the present disclosure.

According to some embodiments of the present disclosure, with reference to FIGS. 1-3, in one aspect, a solar cell is provided. The solar cell includes a substrate 100, and the substrate 100 is provided with textured structures 14 on a part of a surface of the substrate 100 (see FIG. 7). The solar cell further includes a doped semiconductor layer 112 disposed on a side of the substrate 100, the doped semiconductor layer 112 has first holes 1120 passing through the doped semiconductor layer 112, the first holes 1120 correspond on a one-to-one basis with the textured structures 14, and a bottom of a respective first hole of the first holes 1120 exposes a corresponding textured structure 14. The solar cell further includes a passivation layer 113 formed over the doped semiconductor layer 112. The passivation layer 113 fills the first holes 1120 and covers the textured structures 14. The solar cell further includes a plurality of electrodes 114 arranged along a first direction X, and the plurality of electrodes 114 pass through the passivation layer 113 and are in electrical contact with the doped semiconductor layer 112.

In some embodiments, the substrate 100 may be made of an elementary semiconductor material. Specifically, the elementary semiconductor material consists of a single element, for example, may be silicon or germanium. The elementary semiconductor material may be in a monocrystalline state, a polycrystalline state, an amorphous state, or a microcrystalline state (a state with both monocrystalline and amorphous states is referred to as microcrystalline state), and for example, the silicon may be at least one of monocrystalline silicon, polycrystalline silicon, amorphous silicon, or microcrystalline silicon.

In some embodiments, the substrate 100 may also be made of a compound semiconductor material. Common compound semiconductor materials include, but are not limited to, silicon germanium, silicon carbide, gallium arsenide, indium gallium, perovskite, cadmium telluride, copper indium selenide, and the like. The substrate 100 may also be a sapphire substrate, a silicon-on-insulator substrate, or a germanium-on-insulator substrate.

In some embodiments, the substrate 100 may be an N-type semiconductor substrate or a P-type semiconductor substrate. The N-type semiconductor substrate is doped with N-type doping elements, the N-type doping elements may be any of Group V elements such as phosphorus (P), bismuth (Bi), antimony (Sb), or arsenic (As). The P-type semiconductor substrate is doped with P-type doping elements, and the P-type doped elements may be any of Group III elements such as boron (B), aluminum (Al), gallium (Ga), or indium (In).

In some embodiments, the substrate 100 has a first surface 11 and a second surface 12 opposite to the first surface 11. The first surface 11 of the substrate 100 may be a front surface and the second surface 12 is a rear surface, or the first surface of the substrate may be a rear surface and the second surface is a front surface. The solar cell is a single-sided cell, the front surface serves as a light receiving surface for receiving incident light and the rear surface serves as a light shading surface. In some embodiments, the solar cell is a bifacial cell, i.e., both of the first surface and the second surface of the substrate may serve as light receiving surfaces, both are operable to receive incident light. Here, the light shading surface may also receive incident light, except that an efficiency of receiving the incident light by the light shading surface is weaker than the efficiency of receiving the incident light by the light receiving surface.

In the solar cell shown in FIG. 3, FIG. 10 and FIG. 13 described below, the first surface of the substrate is the front surface and the second surface of the substrate is the rear surface. The solutions of the solar cell shown in FIG. 3, FIG. 10 and FIG. 13 described below are modified on the rear surface of the solar cell and the doped semiconductor layer 112 is arranged on the rear surface of the substrate, to improve the passivation performance of the rear surface of the solar cell. In the solar cell shown in FIG. 3, FIG. 10 and FIG. 13 described below, a side of the substrate facing upward serves as the light receiving surface and the side of the substrate facing downward serves as the light shading surface.

Figure 10:
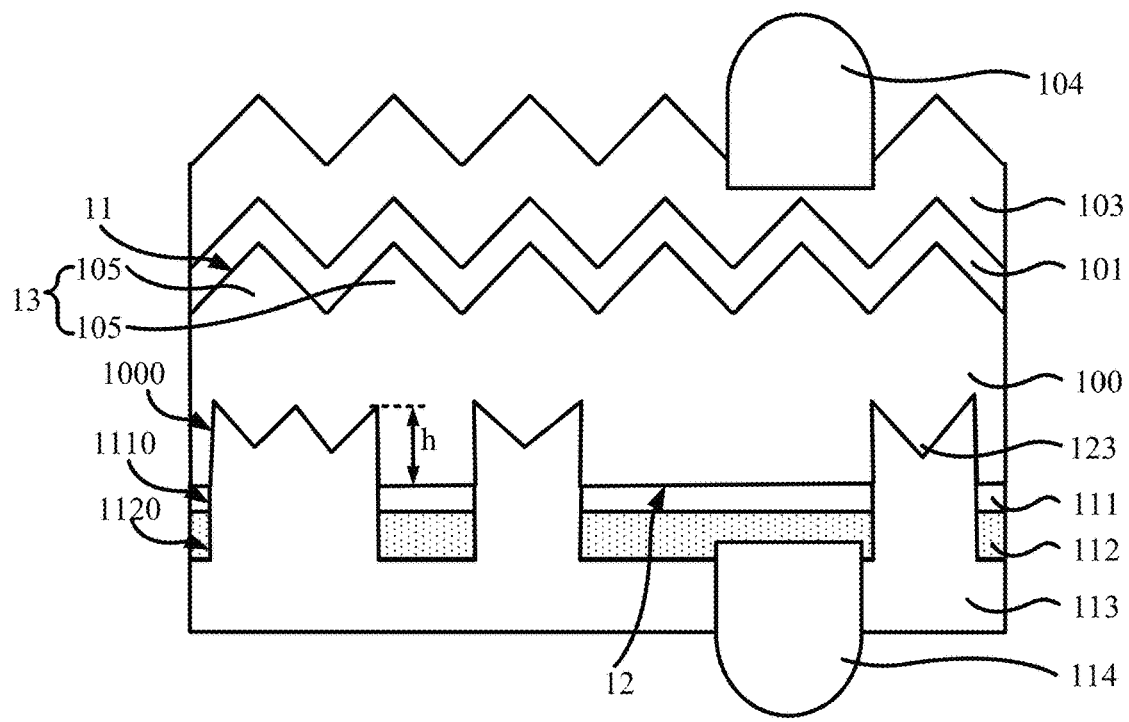
FIG. 10 is a schematic diagram illustrating a cross-sectional view of a solar cell in accordance with an embodiment of the present disclosure.
Figure 13:
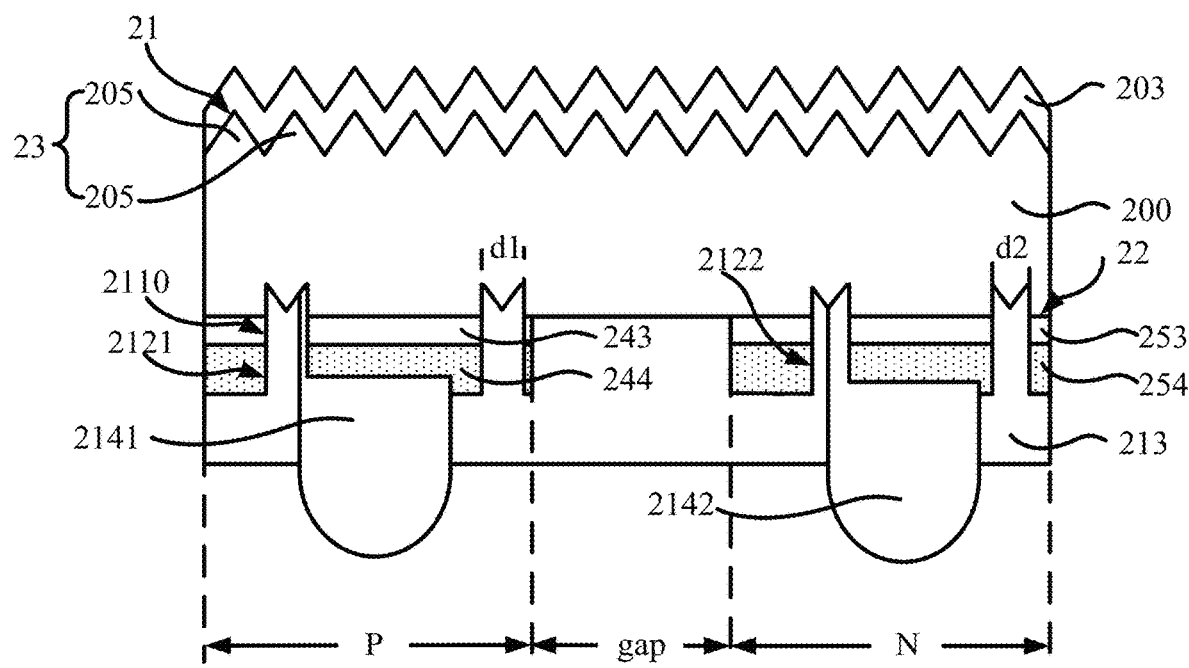
FIG. 13 is a schematic diagram illustrating a cross-sectional view taken along a line B1-B2 in FIG. 12.

In some embodiments, the doped semiconductor layer 112 may be arranged on the first surface, the doped semiconductor layer 112 is disposed on the front surface, and embodiments of the present disclosure does not constitute a limitation to the arrangement of the doped semiconductor layer 112 on the first surface as well as on the second surface, only needed is that the doped semiconductor layer 112 is arranged on the surface of the substrate, and the solar cells shown in FIG. 3, FIG. 10 and FIG. 13 described below are examples.

In some embodiments, the solar cell further includes a dielectric layer 111 arranged between the substrate 100 and the doped semiconductor layer 112. second holes 1110 are defined in the dielectric layer 111 and correspond to the first holes 1120, a bottom of a respective second hole of the second holes 1110 exposes the surface of the substrate 100.

It should be noted that, since the dielectric layer 111 generally serves to guarantee a tunneling functionality of carriers, such that the carriers can tunnel into the doped semiconductor layer 112 via the dielectric layer 111, the dielectric layer 111 is generally thin, and the thickness of the dielectric layer 111 is less than 15 nm, so that during formation of the first holes 1120, the dielectric layer 111 exposed by the first holes 1120 may be correspondingly removed, such that the second holes 1110 are formed within the dielectric layer 111. In some embodiments, the formation of the first holes does not completely causes etch damage to the dielectric layer, the second holes are not generated in the dielectric layer, which is within the protection scope of embodiments of the present disclosure.

In some embodiments, a passivation contact structure is formed between the dielectric layer 111 and the doped semiconductor layer 112, the doped semiconductor layer 112 is capable of forming a band-bending at the surface of the substrate 100, the dielectric layer 111 makes the energy band at the surface of the substrate 100 asymmetrically shift, such that a barrier to majority carriers in the carriers is lower than the barrier to minority carriers in the carriers, so that the majority carriers can more easily undergo quantum tunneling through the dielectric layer 111 and the minority carriers have difficulty passing through the dielectric layer 111, thereby enabling selective transport of the carriers.

Further, the dielectric layer 111 acts as a chemical passivation. Specifically, since the presence of interface state defects at the interface between the substrate 100 and the dielectric layer 111, an interface state density at the front surface of the substrate 100 is relatively large, the increased interface state density promotes recombination of photo-generated carriers, increases a fill factor, short circuit current, and open circuit voltage of the solar cell, thereby increasing a photoelectric conversion efficiency of the solar cell. The dielectric layer 111 is disposed on the second surface 12 of the substrate 100, such that the dielectric layer 111 acts chemical passivation on the surface of the substrate 100, specifically by saturating dangling bonds of the substrate 100, reducing a defect state density of the substrate 100, and reducing recombination centers of the substrate 100 to reduce carrier recombination rate.

In some embodiments, the dielectric layer 111 has a thickness in a range of 0.5 nm to 5 nm. The thickness of the dielectric layer 111 may range from 0.5 nm to 1.3 nm, 1.3 nm to 2.6 nm, 2.6 nm to 4.1 nm, or 4.1 nm to 5 nm. Within any of the above ranges, the thickness of the dielectric layer 111 is relatively thin, and the majority carriers can more easily undergo quantum tunneling through the dielectric layer 111, and the minority carriers have difficulty to pass through the dielectric layer 111, thereby achieving selective transport of carriers.

In some embodiments, the doped semiconductor layer 112 acts as a field passivation. Specifically, an electrostatic field directing towards an interior of the substrate 100 is formed at the surface of the substrate 100, and the minority carriers are caused to escape the interface, thereby reducing a minority carrier concentration, such that the carrier recombination rate at the interface of the substrate 100 is reduced, thereby increasing the open circuit voltage, the short circuit current and fill factor of the solar cell, and improving the photoelectric conversion efficiency of the solar cell.

The doped semiconductor layer 112 may be doped with doping element of the same type as the substrate 100, e.g., the doping element of the substrate 100 is N-type, and the doped semiconductor layer 112 is doped with N-type doping elements.

In some embodiments, the doped semiconductor layer 112 includes at least one of a doped amorphous silicon layer, a doped polysilicon layer, a doped microcrystalline silicon layer, a doped silicon carbide layer, or a doped crystalline silicon layer.

Referring to FIG. 4 and FIG. 5, in some embodiments, a single first hole 1120 has a one-dimensional size d ranging from 5 µm to 20 µm. The one-dimensional size d of the single first hole 1120 ranges from 5 µm-8 µm, 8 µm-13 µm, 13 µm-15.2 µm, 15.2 µm-17 µm, or 17 µm-20 µm. The range of the one-dimensional size d of the single first hole 1120 is in any of the above ranges, then the single first hole 1120 has a suitable size, such that the presence of the first holes 1120 has less influence on a strength of the doped semiconductor layer 112, thereby effectively avoiding a peeling between the doped semiconductor layer 112 and the substrate 100. Having the one-dimensional size of d within any of the above ranges, the first holes 1120 may also be filled by the passivation layer 113 without forming a void, thereby improving a cell efficiency of the solar cell.

In some embodiments, the one-dimensional size d of the single first hole 1120 is in any of the ranges described above, and the number of the first holes 1120 and the one-dimensional size d can be used to provide space for a thermal deformation of the doped semiconductor layer 112 and a thermal deformation of the passivation layer 113, to reduce a chance of curling of the solar cell.

In some embodiments, referring to FIG. 5, which shows various configuration examples of the single first hole in the solar cell in accordance with an embodiment of the present disclosure, the shape of the single first hole 1120 may be circular, rectangular, oval, or triangular as shown in FIG. 5.

In some embodiments, the one-dimensional size d of the single first hole 1120 may be the diameter of a circle, length of a side of a rectangle or triangle, or length of a major axis of an ellipse, and the one-dimensional size d may also be length of a connecting line between two corners.

In some embodiments, the doped semiconductor layer 112 is doped with the N-type doping element, the single first hole 1120 has the one-dimensional size d less than or equal to 30 µm. The one-dimensional size d of the single first hole 1120 is less than or equal to 28 µm, is less than or equal to 23 µm, or is less than or equal to 20 µm.

In some embodiments, the doped semiconductor layer 112 is doped with the N-type doping element, the N-type doping element causes the doped semiconductor layer 112 to have uniform grains and to have a single crystal structure, and the doped semiconductor layer 112 with the N-type doping element has smaller particles, a larger number of grain boundaries and uniform grain boundaries, and the one-dimensional size d of the formed first hole 1120 is larger.

In some embodiments, the doped semiconductor layer 112 is doped with the P-type doping element, the one-dimensional size d of the single first hole 1120 is less than or equal to 10 µm. The one-dimensional size d of the single first hole 1120 may less than or equal to 8 µm, less than or equal to 5.8 µm or less than or equal to 4.3 µm. The one-dimensional size d of the first hole is in any of the ranges described above, the first hole 1120 has a smaller diameter, such that the presence of the first hole 1120 has less influence on the strength of the doped semiconductor layer 112, the peeling between the doped semiconductor layer 112 and the substrate 100 may be effectively avoided. Having the one-dimensional size of d within any of the above ranges, the first holes 1120 may also be filled by the passivation layer 113 without forming the void, thereby improving the cell efficiency of the solar cell.

In some embodiments, the doped semiconductor layer 112 is doped with the P-type doping element, there is better compatibility between the P-type doped element and the dielectric layer 111. Taking the P-type doped element being the B element as an example, the B element may form a B—O bond with the oxygen element and a B—Si bond with the silicon element, thereby allowing better contact performance between the doped semiconductor layer 112 and the dielectric layer 111, such that a extent of the edge region is smaller and the one-dimensional size d of the formed first hole 1120 is smaller.

Referring to FIG. 6 and FIG. 9, the substrate is provided with a truncated pyramid structure on the second surface, the truncated pyramid structure includes a plurality of truncated pyramids 124, a respective truncated pyramid of a portion of the plurality of truncated pyramids 124 is in contact with a truncated pyramid adjacent to the respective truncated pyramid. A truncated pyramid refers to a remaining portion by polishing the top of a pyramid, and has a height less than one-third height of the original pyramid.

With continued reference to FIG. 3 and FIG. 7, the textured structures 14 and the first holes 1120 form a light trapping structure, and the textured structures 14 can increase an internal reflection of sunlight, thereby increasing a light absorption rate of the doped semiconductor layer as well as the substrate. Each textured structure 14 includes at least one raised structure 123, and one first hole 1120 corresponds to 1 to 5 raised structures 123. In this manner, the internal reflection of incident light can be increased, thereby improving a photoelectric conversion efficiency. The number of raised structures 123 within one first hole 1120 is in the above range, the size of the raised structures 123 is relatively large, defects on the surface of the substrate 100 are small, the recombination center of the substrate 100 is small, and the passivation layer 113 can provide good passivation to the substrate 100.

In some embodiments, the textured structure 14 may include a pyramid structure, a prismatic structure, or a raised structure. The pyramid structure includes an inverted pyramid and a positive pyramid. FIG. 7 takes the textured structure 14 including two positive pyramids as an example.

In some embodiments, the electrode 114 is in contact with the raised structure 123, so as to increase a contact area between the raised structure 123 and the electrode 114, thereby enhancing a contact performance between the electrode 114 and the raised structure 123 and increasing a yield of the cell.

In some embodiments, referring to FIG. 8, the one-dimensional size S of the raised structure 123 ranges from 1 μm to 20 μm and the height h1 of the raised structure 123 ranges from 1 μm to 20 μm. In some embodiments, the one-dimensional size S of the raised structure 123 ranges from 1 μm to 5 μm, 5 μm to 8 μm, 8 μm to 13 μm, 13 μm to 15 μm, or 15 μm to 20 μm. The height h1 of the raised structure 123 ranges from 1 μm to 4 μm, 4 μm to 10 μm, 10 μm to 14 μm, 14 μm to 16 μm, or 16 μm to 20 μm.

In some embodiments, the passivation layer 113 may be of a single layer structure or a stacked layer structure, and may be made of one or more of silicon oxide, silicon nitride, silicon oxynitride, silicon oxycarbonitride, titanium oxide, hafnium oxide, or aluminum oxide.

In some embodiments, the solar cell further includes an antireflection layer formed over the passivation layer, and the electrodes pass through the antireflection layer and the passivation layer and is in electrical contact with the doped semiconductor layer. The antireflection layer serves to reduce or eliminate reflected light from the surface of the solar cell, thereby increasing the amount of light transmission from the surface of the solar cell, reducing or eliminating stray light from a system, the antireflective layer may be made of silicon nitride or silicon oxynitride.

FIG. 10 is a schematic diagram illustrating a cross-sectional view of a solar cell in accordance with an embodiment of the present disclosure. The substrate includes recesses correspond on a one-to-one basis with the first holes, and the textured structures are arranged within the recesses.

In some embodiments, a single recess 1000 has a depth h in the range of 0.1 μm to 4 μm. The depth h of the single recess 1000 ranges from 0.1 μm to 0.5 μm, 0.5 μm to 2 μm, 2 μm to 2.6 μm, 2.6 μm to 3.2 μm, or 3.2 μm to 4 μm.

In some embodiments, the doped semiconductor layer 112 is doped with the N-type doping element, the depth h of the single recess 1000 is less than 3 μm. In some embodiments, the doped semiconductor layer 112 is doped with the P-type dopant element, the depth h of the single recess 1000 is less than 4 μm.

In some embodiments, the depth h of the single recess 1000 is in any of the above ranges, thus a situation that the recesses 1000 pass through the substrate 100 and then results in a breakdown of the substrate can be avoided, and the recesses 1000 may also serve as a light trapping structure to improve internal reflection of the solar cell.

In some embodiments, referring to FIG. 4, the doped semiconductor layer 112 has a boundary 115, the number of first holes 1120 near the boundary 115 is greater than the number of first holes 1120 away from the boundary 115. As such, the number of first holes 1120 near the boundary 115 is relatively large, whereas the number of first holes 1120 away from the boundary 115 is relatively small, the number of the electrodes located within the first holes 1120 is also reduced, so as to increase the collection area of the electrodes 114. The greater number of first holes 1120 near the boundary 115 results in a lesser strength of the doped semiconductor layer 112 near the boundary 115 and a corresponding decrease in the chance of edge breakage.

In some embodiments, referring to FIG. 6 as well as FIG. 9, the first holes 1120 near the boundary 115 are spaced apart and discontinuous, as such, the one-dimensional size d of the first hole 1120 is smaller, every two first holes 1120 are further separated by the doped semiconductor layer 112, and for the edge region of the substrate, the doped semiconductor layer 112 is also used to collect carriers of the substrate and the carriers are eventually collected by the electrodes.

In some embodiments, the greater number of first holes 1120 near the boundary 115 results in a corresponding decrease of a total doping concentration of the doped semiconductor layer 112 near the boundary 115, which in turn can reduce the chance of electric leakage at the edge.

In some embodiments, a portion of electrodes 114 are arranged in the first holes 1120 and cover the textured structures 14. This portion of electrodes 114 are in direct electrical contact with the substrate 100 through the first holes 1120, so that the electrodes 114 can directly collect carriers generated by the substrate 100. The first holes 1120 may serve as an additional conductive channel to improve a current collection efficiency of the edge region, and counteract an effect of less efficient caused by a pinhole effect of the dielectric layer 111.

With continued reference to FIG. 3, the solar cell further includes an emitter 101 disposed on the first surface 11, another passivation layer 103 formed over the emitter 101, and fingers 104 passing through the another passivation layer 103 and in electrical contact with the emitter 101.

In some embodiments, the emitter 101 and the substrate 100 are of the same material, and the emitter 101 and the substrate 100 may be formed from the same original substrate after a doping process. The type of doping element within the emitter 101 is different from the type of doping element within the substrate 100. A doping process is performed on a part of the original substrate along a thickness direction of substrate, the part of the original substrate subjected to the doping process serves as the emitter and the remaining original substrate serves as the substrate.

In some embodiments, the emitter 101 is a doped layer formed over the first surface of the substrate, and is a semiconductor layer formed by a deposition process and doped with the N-type doping element or the P-type doping element. The semiconductor layer may be silicon, germanium, or polysilicon.

In some embodiments, the substrate is provided with a first textured structure 13, the first textured structure 13 includes a plurality of raised structures 105.

In some embodiments, the another passivation layer 103 may be of a single layer structure or a stacked layer structure, and may be made of one or more of silicon oxide, silicon nitride, silicon oxynitride, silicon oxycarbonitride, titanium oxide, hafnium oxide, or aluminum oxide.

In some embodiments, the another passivation layer 103 and the passivation layer 113 are of the same material, and are prepared by the same preparation process.

In some embodiments, the electrodes 114 and the fingers 104 may be obtained by sintering a burn-through paste. The method of forming the electrodes 114 includes: printing a metal paste on a portion of the surface of the passivation layer 113 by using a screen printing process. The method of forming the finger 104 includes: printing a metal paste on a portion of the surface of the another passivation layer 103 by using a screen printing process. The metal paste may include at least one of silver, aluminum, copper, tin, gold, lead, or nickel.

In some embodiments, the solar cell may be of a bifacial TOPCon cell structure, and the solar cell may further include a tunnel dielectric layer disposed on the first surface, and a doped polysilicon layer disposed on a surface of the tunnel dielectric layer. A doping type of the doped polysilicon layer is different from a doping type of the substrate, e.g., the substrate is doped with the N-type doping element, and the doped polysilicon layer is doped with the P-type doping element.

In some embodiments, the dielectric layer and the doped semiconductor layer are disposed on the first side of the substrate, and the tunnel dielectric layer and the doped polysilicon layer are disposed on the second side of the substrate.

In some embodiments, the dielectric layer and the doped semiconductor layer are disposed on the first side of the substrate, the solar cell further includes an intrinsic dielectric layer, a doped amorphous silicon layer and a transparent conductive layer. The intrinsic dielectric layer is disposed on the second surface of the substrate, the doped amorphous silicon layer is disposed on a surface of the intrinsic dielectric layer, and the transparent conductive layer is disposed on a surface of the doped amorphous silicon layer, the electrodes are in electrical contact with the doped semiconductor layer, and the fingers are in electrical contact with the transparent conductive layer.

With continued reference to FIG. 3, the substrate is provided with a pyramidal structure 13 on the first surface, the pyramidal structure 13 includes a plurality of pyramids 105, and the substrate is provided with the textured structures 14 on the second surface, the one-dimensional size of a single raised structure 123 of the textured structures is less than or equal to the one-dimensional size of a single pyramid 105.

In the solar cell provided by embodiments of the present disclosure, the substrate 100 is provided with textured structures 14 on its surface, the first holes 1120 are formed within the doped semiconductor layer 112, the first holes 1120 correspond on a one-to-one basis with the textured structures 14, the bottoms of the first holes 1120 exposes the textured structures 14. The textured structures 14 can improve internal reflection of the substrate 100, thereby reducing light loss of the solar cell. The first holes 1120 may also serve as the light trapping structures, to enhance internal reflection of incident light within the doped semiconductor layer 112, thereby improving an efficiency of the cell. The passivation layer 113 fills the first holes 1120, and may provide a second passivation to the substrate 100, so that the substrate can be passivated by the passivation layer and the doped semiconductor layer 112 simultaneously, thereby reducing surface defects of the substrate 100, to improve the photoelectric conversion efficiency of the solar cell.

Furthermore, the doped semiconductor layer 112 has the first holes 1120, the first holes 1120 correspond on a one-to-one basis with the textured structures 14, the passivation layer 113 fills the first holes 1120, the cooperation among the doped semiconductor layer 112, the passivation layer 113, the textured structures 14 and the first holes 1120 makes the solar cell guarantee its passivation performance, some light trapping structures are provided on the surface of the substrate to increase an internal reflectivity, thereby increasing the short circuit current as well as the open circuit voltage and thus improving the cell efficiency.

Accordingly, in another aspect, an embodiment of the present disclosure also provide a solar cell, which is different from the embodiments described above in that, the electrodes with a first polarity and the fingers with a second polarity in the embodiments described above are disposed on the first surface and the second surface of the substrate, respectively, in the solar cell provided by another embodiment, both of a first electrode with the first polarity and a second electrode with the second polarity are disposed on the second surface of the substrate, the same or corresponding technical features as those of the above-described embodiments will not be explained in more detail here.

Figure 11:
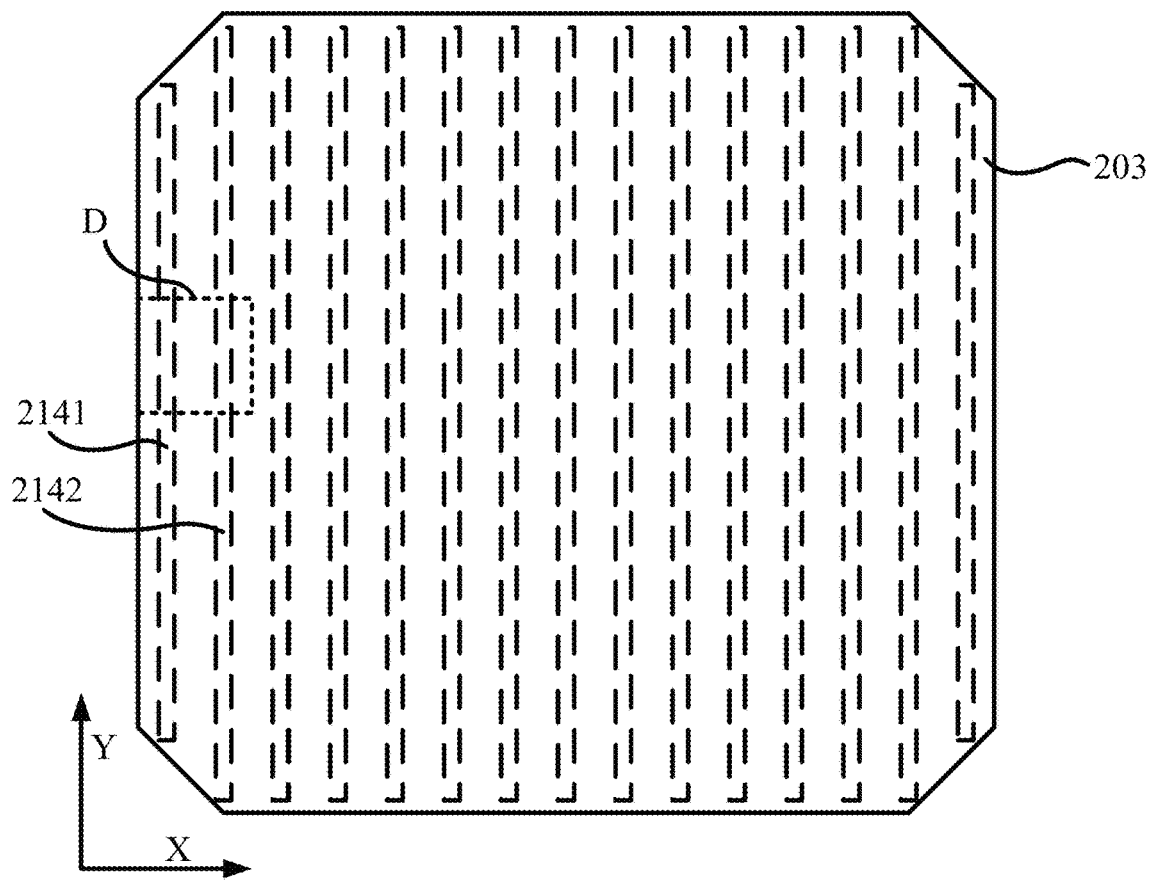
FIG. 11 is a schematic diagram illustrating another structure of a solar cell in accordance with an embodiment of the present disclosure.
Figure 12:
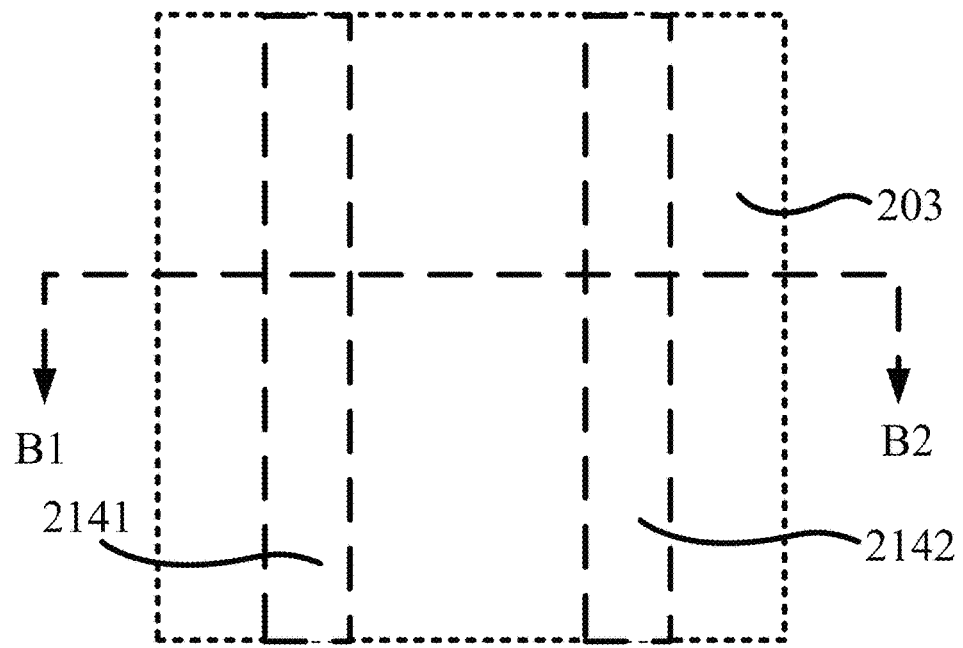
FIG. 12 is an enlarged partial view at D in FIG. 11.

FIG. 11 is a schematic diagram illustrating another structure of a solar cell in accordance with an embodiment of the present disclosure; FIG. 12 is an enlarged partial view at D in FIG. 11; FIG. 13 is a schematic diagram illustrating a cross-sectional view taken along a line B1-B2 in FIG. 12.

Referring to FIG. 11 to FIG. 13, the solar cell includes a substrate 200, and the substrate 200 is provided with textured structures on a part of a surface of the substrate 200. The solar cell further includes a doped semiconductor layer disposed on a side of the substrate 200, the doped semiconductor layer has first holes passing through the doped semiconductor layer, the first holes correspond on a one-to-one basis with the textured structures, a bottom of a respective first hole of the first holes exposes a corresponding textured structure. The solar cell further includes a passivation layer 213 formed over the doped semiconductor layer. The passivation layer 213 fills the first holes and covers the textured structures. The solar cell further includes a plurality of electrodes arranged at intervals along the first direction X, and the plurality of electrodes pass through the passivation layer 213 and are in electrical contact with the doped semiconductor layer.

In some embodiments, the substrate 200 has a first surface 21 and a second surface 22 opposite to the first surface. The substrate 200 is provided with a pyramidal structure 23 on the first surface 21, and the pyramidal structure 23 includes a plurality of pyramids 205. A front surface field (hereinafter FSF) is formed at the first surface 21, in which doping ion has the same conductivity type as that of the substrate 200, and a surface minority concentration is reduced by utilizing a field passivation effect, thereby reducing the surface recombination rate, while also reducing series resistance and increasing electron transport capability.

In some embodiments, the substrate 200 is provided with P regions, N regions and gap regions on the second surface 22, the P regions and the N regions are arranged alternatingly, a respective gap region is sandwiched between a respective P region and a N region adjacent to the respective P region.

In some embodiments, referring to FIG. 13, the gap region is level with the P region and the N region, i.e., the substrate is not etched, insulation between the P region and the N region is achieved by some isolating film layers, the isolating film layer may be a passivation layer.

It should be noted that, the gap region being level with the P region and the N region means that a height difference between a top surface of the gap region and top surfaces of the P region and N region is within 1 µm and is not absolutely aligned.

In some embodiments, the gap region is lower than the P-region and the gap region is lower than the N-region. That is, a groove extending from the second surface towards the first surface is defined in the gap region, so that the groove enables automatic isolation between regions of different conductivity type, so as to prevent heavily doped P-regions and N-regions in IBC cells (Interdigitated Back Contact Cells) from generating PN junctions which result in electric leakage and affect cell efficiency.

In some embodiments, the surface of the gap region may be a polished surface or the surface of the gap region may be provided with a second textured structure, the first textured structure has a roughness greater than or equal to the roughness of the second textured structure.

Therein, "roughness" refers to, an arithmetic average of absolute values of vertical deviation amounts of peaks and valleys within a sampling length with respect to a mean horizontal line. Roughness may be measured by comparison method, optical cutting method, interferometry method and stylus method.

In some embodiments, the doped semiconductor layer includes a first doped semiconductor layer 244 at the P region and a second doped semiconductor layer 254 at the N region, the electrodes include a first electrode 2141 in electrical contact with the first doped semiconductor layer 244 and a second electrode 2142 in electrical contact with the second doped semiconductor layer 254. The passivation layer 213 further covers the surface of the substrate at the gap region. The first doped semiconductor layer 244 includes first sub-holes 2121, a bottom of a respective first sub-hole 2121 exposes a corresponding textured structure, and/or the second doped semiconductor layer 254 includes second sub-holes 2122, a bottom of a respective second sub-hole 2122 exposes a corresponding textured structure.

In some embodiments, the one-dimensional size of a single first sub-hole 2121 is less than the one-dimensional size of a single second sub-hole 2122.

In some embodiments, the dielectric layers include a first dielectric layer 243 and a second dielectric layer 253, the first doped semiconductor layer 244 is disposed on the first dielectric layer 243, and the second doped semiconductor layer 254 is disposed on the second dielectric layer 253.

In some embodiments, a second hole 2110 is provided within the first dielectric layer. The second hole 2110 is also provided within the second dielectric layer.

In some embodiments, the first dielectric layer 243 and the second dielectric layer 253 may be the same as the dielectric layer 111 in the embodiments as described above, i.e., the first dielectric layer 243 and the second dielectric layer 253 are tunnel dielectric layers. Similarly, the first doped semiconductor layer 244 as well as the second doped semiconductor layer 254 may be the doped semiconductor layer 112 in the embodiments as described above, except that the first doped semiconductor layer 244 is doped with the P-type doped element and the second doped semiconductor layer 254 is doped with the N-type doped element.

In some embodiments, the first electrode 2141 and the second electrode 2142 may be referred to the electrodes 114 in the embodiments as described above, the pyramidal structure 23 on the first surface 21, the pyramids 205 and the first passivation layer 203 may be referred to the pyramidal structure 13, the pyramids 105 and the another passivation layer 103 in the embodiments as described above, the passivation layer 213 may be referred to the passivation layer 113 in the embodiments as described above, which are not described in detail herein.

FIG. 14 to FIG. 20 are schematic diagrams illustrating structures of a solar cell corresponding to operations in a method of preparing the solar cell in accordance with an embodiment of the present disclosure. Embodiments of the present disclosure are exemplified by the solar cell provided in another embodiment.

Figure 14:
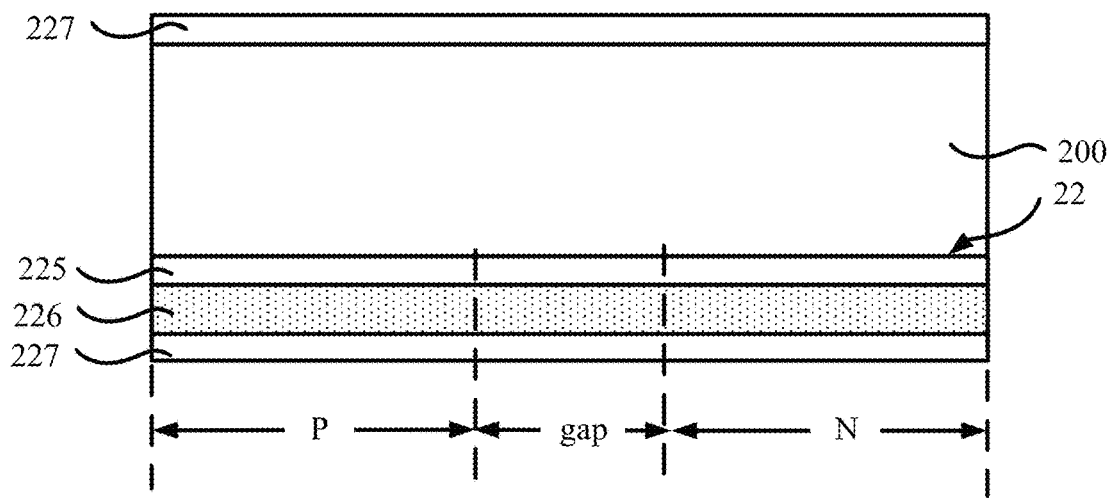
FIGS. 14 to 20 are schematic diagrams illustrating structures of a solar cell corresponding to operations in a method of preparing the solar cell in accordance with an embodiment of the present disclosure.

Referring to FIG. 14, the method of preparing the solar cell includes: providing a substrate 200 having a first surface and a second surface 22 opposite to the first surface.

In some embodiments, a P region and an N region are provided on the second surface 22, and a gap region is arranged between the P region and the N region.

Referring to FIG. 14 to FIG. 18, a doped semiconductor layer is formed on the substrate.

Referring to FIG. 14 to FIG. 17, a doped conductive film is formed, the doped conductive film covers the P region, the N region, and the gap region, and a part of the substrate at the gap region is etched to remove a part of the doped conductive film at the gap region.

Referring to FIG. 14, a first dielectric film 225 is formed on the second surface 22 of the substrate, and a first doped semiconductor film 226 is formed on a surface of the first dielectric film 225 away from the substrate. At the same time of forming the first doped semiconductor film 226, first doped silicon glass layers 227 are formed on the first surface of the substrate 200 and a surface of the first doped semiconductor film 226 away from the first dielectric film, respectively.

In some embodiments, the first dielectric film 225 is formed by using thermal oxygen or chemical deposition. The first dielectric film 225 is arranged at the P region, the N region, and the gap region.

In some embodiments, the preparing method for forming the first doped semiconductor film 226 includes: performing a first deposition to form an intrinsic semiconductor film, performing a second deposition to form a doped semiconductor film, and subjecting to a high temperature oxidation. During the first deposition, the deposition gas includes silane, the flow rate is controlled in a range of 100-1000 sccm, the deposition temperature is in a range of 400-700° C., During the second deposition, the deposition gas includes doping source gas and oxygen, the flow rate is controlled in a range of 100-3000 sccm, the deposition temperature is in a range of 700-1000° C. During the high temperature oxidation, the gas includes nitrogen and oxygen, the doped semiconductor film is converted into the first doped semiconductor film 226, and the first doped silicon glass layers 227 are formed on the first surface of the substrate 200 and the surface of the first doped semiconductor film 226.

Figure 15:
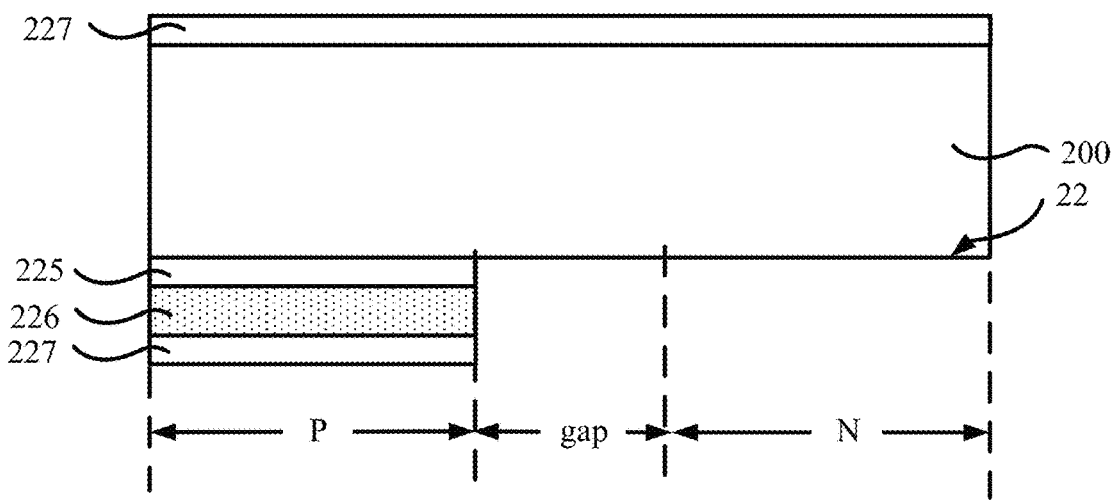

Referring to FIG. 15, the first doped silicon glass layer 227 at the gap region and the N region is removed.

The first doped silicon glass layer 227 on the first surface and at the P region, as doping sources, are subjected to a high temperature diffusion processing, so that the first doped semiconductor film 226 is doped with the P-type doping elements in the first doped silicon glass layer 227 at the P region and a portion of the substrate near the first surface is doped with the P-type doping elements in the first doped silicon glass layer 227 on the first surface. After the high temperature diffusion processing, the first doped silicon glass layer 227 on the first surface and at the P region are removed.

In some embodiments, during the removal of the first doped silicon glass layer 227, the first doped semiconductor film 226 and the first dielectric film 225 may be subjected to etching processing in an etching solution, thus the first doped semiconductor film 226 and the first dielectric film 225 may be potentially removed.

Figure 16:
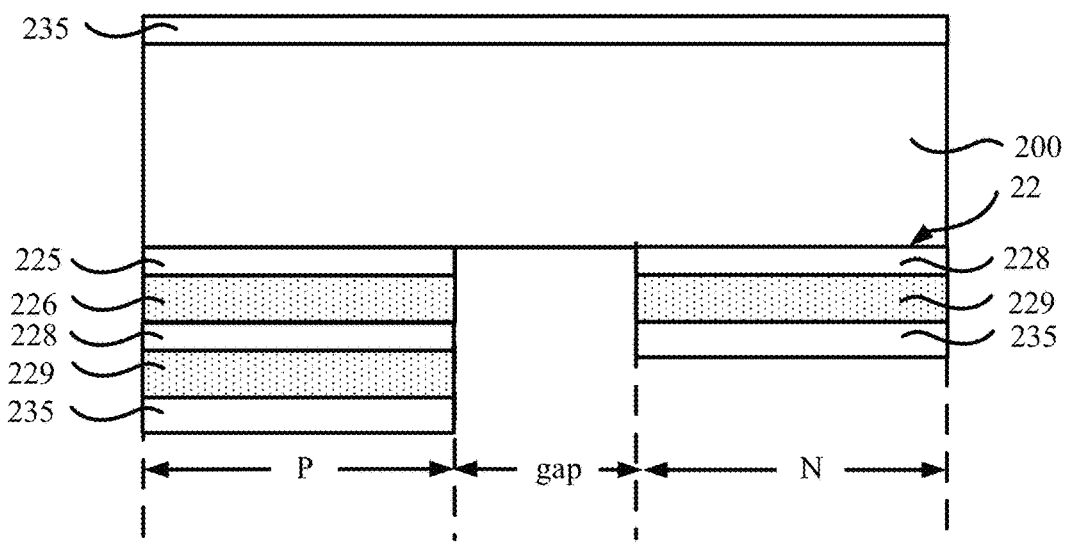

Referring to FIG. 16, a second dielectric film 228 and a second doped semiconductor film 229 are formed on the surface of the substrate at the N region and on the surface of the first doped semiconductor film 226. At the same time of forming the second doped semiconductor film 229, second doped silicon glass layers 235 are formed on the first surface of the substrate 200 and the surface of the second doped semiconductor film 229.

Figure 17:
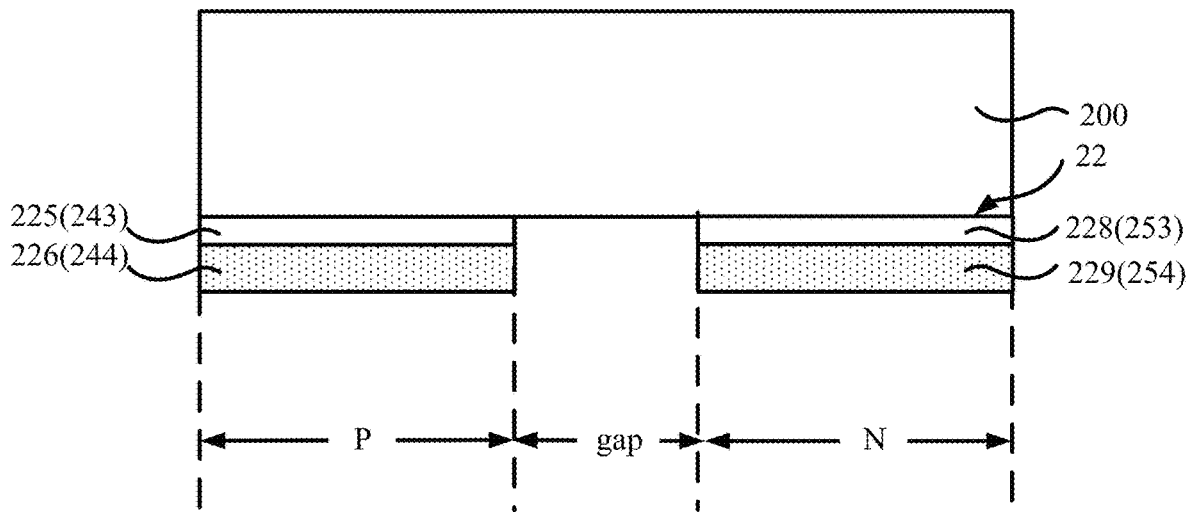

Referring to FIG. 17, the second doped silicon glass layer 235 on the first surface, and the second doped silicon glass layer 235 at the P region are removed. The second dielectric film 228 and the second doped semiconductor film 229 at the P region are removed. The first dielectric film 225 and the first doped semiconductor film 226 at the P region serves as the first dielectric layer 243 and the first doped semiconductor layer 244, respectively. The second dielectric film 228 and the second doped semiconductor film 229 at the N region serve as the second dielectric layer 253 and the second doped semiconductor layer 254, respectively.

Figure 18:
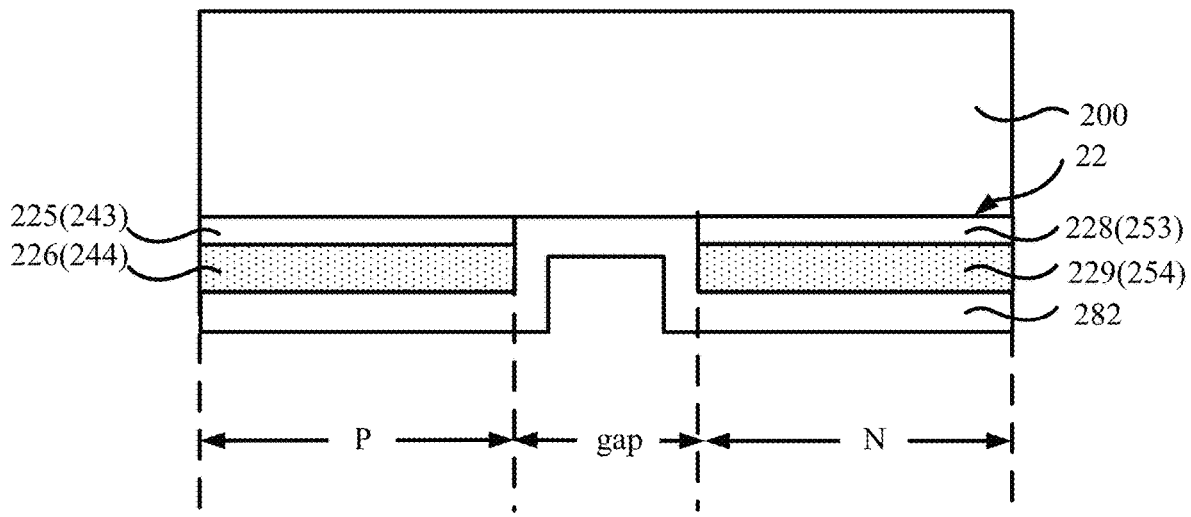

Referring to FIG. 18, a protective layer 282 is formed on the first doped semiconductor layer 244, on the second doped semiconductor layer 254, and on the surface of the substrate at the gap region. The protective layer 282 may be a protective gas, a water film, a masking layer, or the like.

Figure 19:
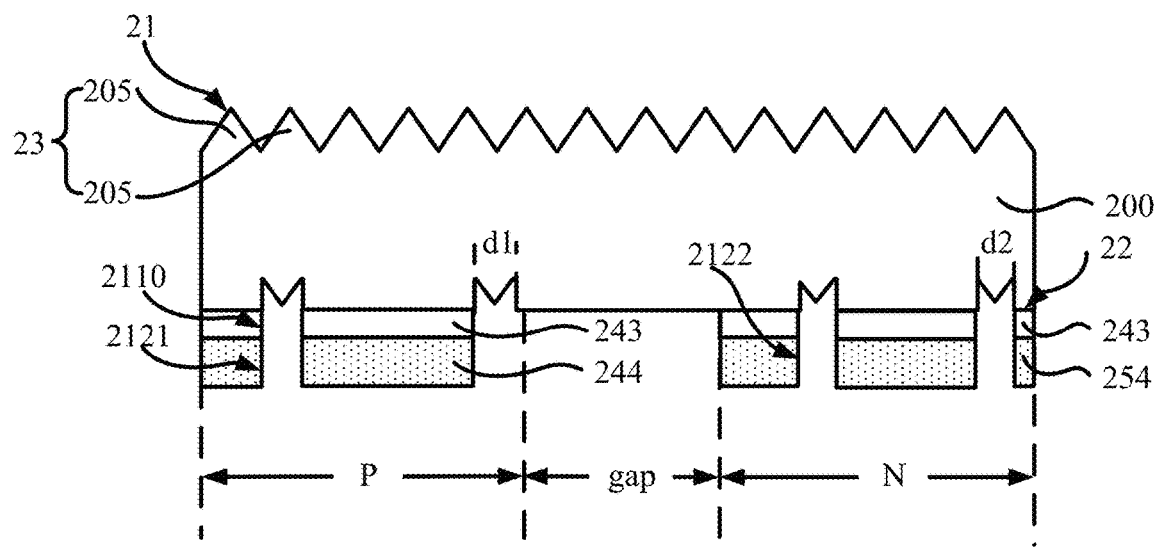

Referring to FIG. 19, the first surface is subjected to a texturing process such that a pyramidal structure 23 is provided on the first surface, first holes passing through the doped semiconductor layer are formed within the doped semiconductor layer and textured structures are formed at the second surface, first holes correspond on a one-to-one basis with the textured structures, a bottom of a respective first hole exposes a corresponding textured structure.

In some embodiments, the texturing process includes: chemical etching, for example, the substrate 200 may be cleaned with a mixed solution of potassium hydroxide and hydrogen peroxide solution, and specifically the pyramidal structure with a desired morphology may be formed by controlling the ratio of concentrations of the potassium hydroxide and hydrogen peroxide solution. In some embodiments, the pyramidal structure may also be formed by methods of laser etching, mechanical, plasma etching, or the like. During laser etching, laser process parameters are controlled to obtain the textured structures with the desired morphology.

In some embodiments, the etching solution for the etching process is controlled to generate first sub-holes 2121 within a portion of the first doped semiconductor layer 244 and to generate second sub-holes 2122 within the second doped semiconductor layer 254 during the removal of the first doped silicon glass layer 227 and the second doped silicon glass layer 235 and during the texturing process.

Figure 20:
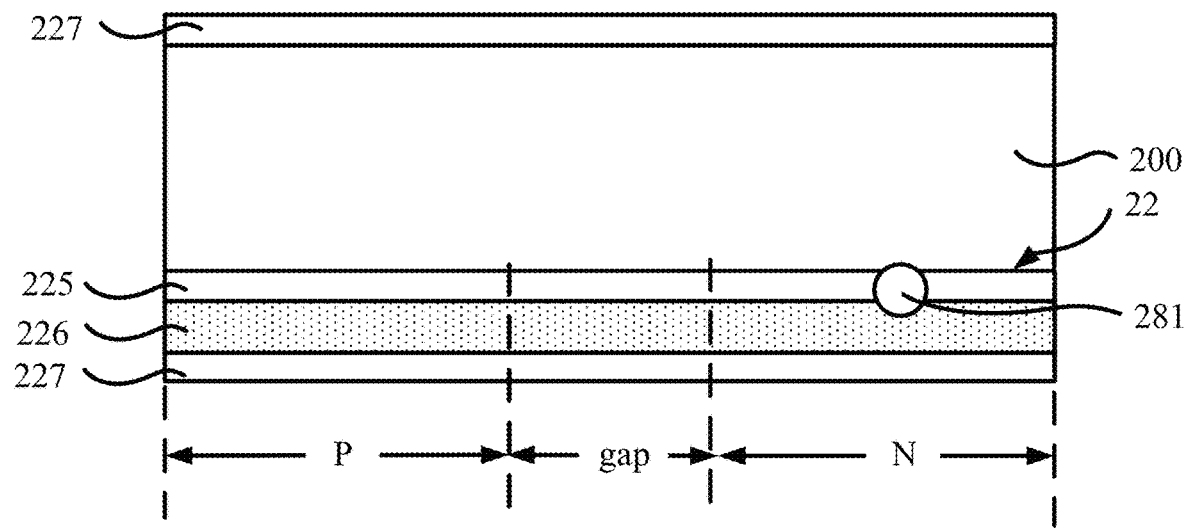

In some embodiments, referring to FIG. 20, prior to forming the doped semiconducting film, there are impurities 281 on the substrate, the thickness of the doped semiconductor film formed is small, so that the thickness of the doped semiconductor film on the impurity 281 is thin, and during the texturing process for the first surface of the substrate, the doped semiconductor layer is subjected to an unavoidable etching effect, thus the first holes and the textured structures are formed.

In some embodiments, the doped semiconductor layer cannot fully effectively protect the substrate due to the limitations of the protective layer. During the texturing process for the substrate, the surface of the substrate is subjected to etching in the etching solution, and thus the textured structures are formed.

In some embodiments, the process parameters of the texturing process include: a mixed solution of sodium hydroxide solution, additives, and aqueous solution, a reaction temperature of 50° C.-100° C., and a reaction time of 200-1200 s. The concentration of the sodium hydroxide solution is 1% to 5% and the concentration of the additives is 0.01% to 1%.

In some embodiments, the first holes may be formed in a texturing processing, in any processing that removes the first doped silicon glass layer 227 or removes the second doped silicon glass layer 235, or through a coordination of two or three of the processing.

In some embodiments, the gap region may be formed prior to, after, or simultaneously with the texturing process. The gap region may have a surface morphology similar to the pyramidal structure.

Referring to FIG. 3, a passivation layer 113 is formed. The passivation layer 113 covers the surface of the doped semiconductor layer, the passivation layer further fills the first holes and covers the textured structures. A plurality of electrodes arranged along the first direction are formed. The plurality of electrodes pass through the passivation layer and are in electrical contact with the doped semiconductor layer.

Referring to FIG. 13, the preparation method includes: forming a passivation layer 213 covering the first sub-holes 2121, the second sub-holes 2122, the gap region, surfaces of the first doped semiconductor layer 244 and the second doped semiconductor layer 254.

With continued reference to FIG. 13, the preparation method includes forming a first passivation layer 203 covering the first surface 21 of the substrate 200.

In some embodiments, the passivation layer 213 and the first passivation layer 203 are formed in the same fabrication process.

With continued reference to FIG. 13, the preparation method includes: forming a first electrode 2141 and a second electrode 2142, the first electrode 2141 passes through the passivation layer 213 and is in electrical contact with the first doped semiconductor layer 244, and the second electrode 2142 passes through the passivation layer 213 and is in electrical contact with the second doped semiconductor layer 254.

In some embodiments, the method of preparing the first electrode 2141 and the second electrode 2142 includes printing a metal paste on a portion of the surface of the passivation layer 213 by using a screen printing process. The metal paste may include at least one of silver, aluminum, copper, tin, gold, lead, or nickel. Then the metal paste is subjected to a sintering process, the metal paste includes a material having highly corrosive components such as glass powder, as such, during sintering, corrosive components corrode the passivation layer 213, thereby causing the metal paste to infiltrate into the passivation layer 213 to electrically contact the first doped semiconductor layer 244 and form the first electrode 2141, and to electrically contact the second doped semiconductor layer 254 and form the second electrode 2142.

Figure 21:
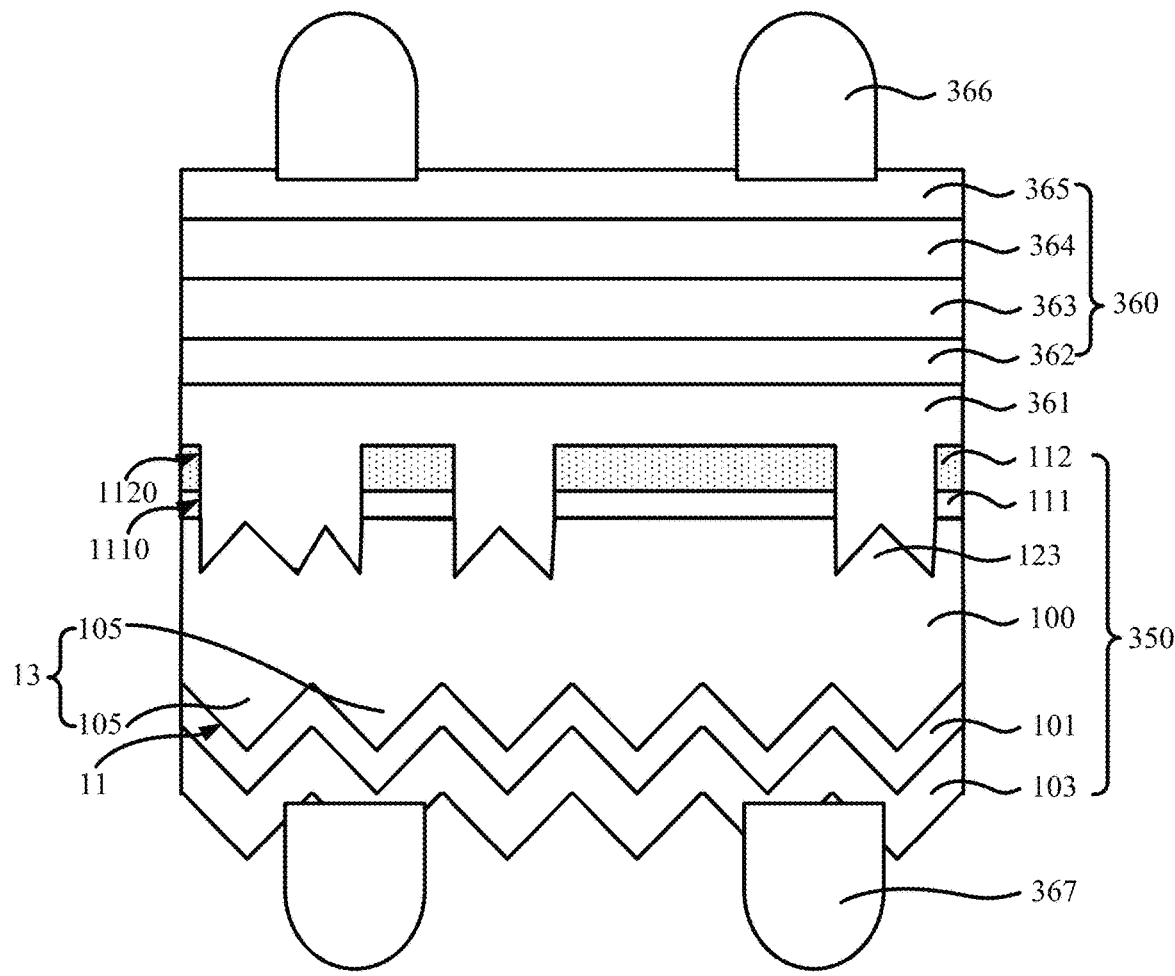
FIG. 21 is a schematic diagram illustrating a structure of a tandem solar cell according to an embodiment of the present disclosure.

Accordingly, FIG. 21 is a schematic diagram illustrating a structure of a tandem solar cell according to an embodiment of the present disclosure. Referring to FIG. 21, an embodiment of the present disclosure provides a tandem solar cell including: a bottom cell 350, which may be the solar cell shown in the embodiments (FIG. 1 to FIG. 10), and a top cell 360 arranged on a surface of an emitter or a surface of a doped semiconductor layer surface in the bottom cell 350.

In some embodiments, the tandem solar cell includes a first finger 366 of a first polarity that is in electrical contact with the top cell 360 and a second finger 367 of a second polarity that is in electrical contact with the bottom cell 350.

In some embodiments, an interface layer 361 is arranged between the top cell and the bottom cell, the interface layer 361 fills the first holes 1120.

It is worth noting that the tandem solar cells in the embodiments of the present disclosure only illustrate two layers of solar cells, and a person skilled in the art can arrange three layers of solar cells as well as more than three layers of multilayer tandem solar cells according to practical requirements.

In some embodiments, the top cell 360 may be a perovskite solar cell. The perovskite solar cell includes a first transport layer 362, a perovskite substrate 363, a second transport layer 364, a transparent conductive layer 365, and an antireflection layer (not shown), which are stacked. The first transport layer is directly aligned with the bottom cell.

In some embodiments, the first transport layer may be one of an electron transport layer or a hole transport layer, and the second transport layer may be the other of the electron transport layer or the hole transport layer.

Figure 22:
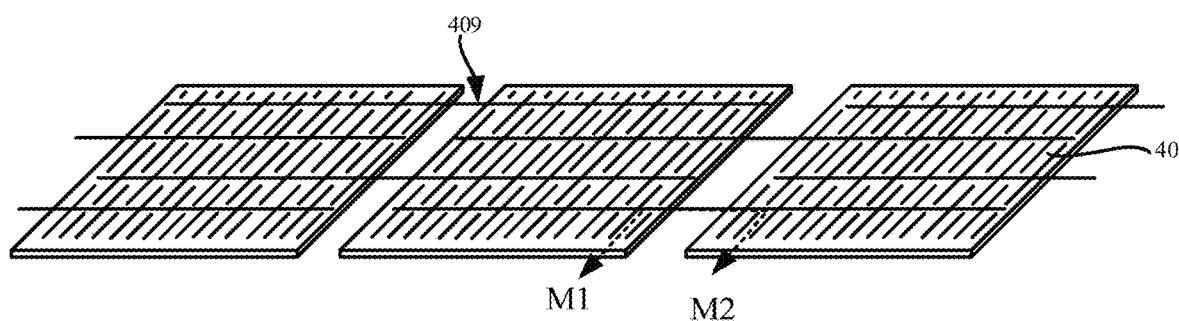
FIG. 22 is a schematic diagram illustrating a structure of a photovoltaic module in accordance with an embodiment of the present disclosure.
Figure 23:
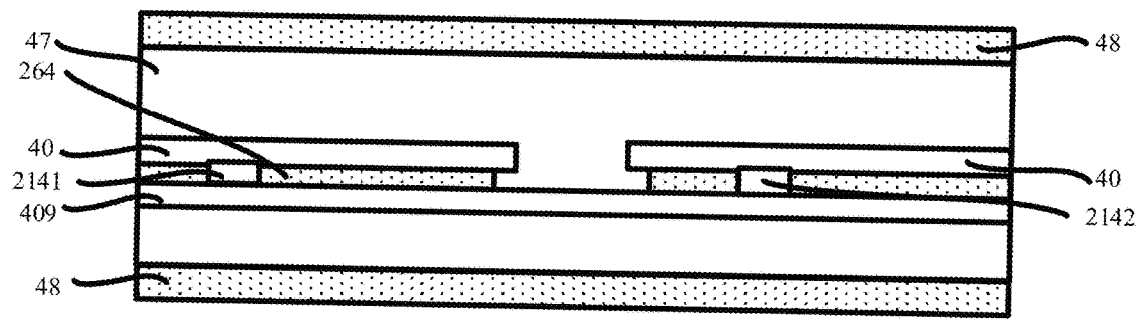
FIG. 23 is a schematic diagram illustrating a cross-sectional view taken along a line M1-M2 in FIG. 22.

FIG. 22 is a schematic diagram illustrating a structure of a photovoltaic module in accordance with an embodiment of the present disclosure; and FIG. 23 is a schematic diagram illustrating a cross-sectional view taken along a line M1-M2 in FIG. 22.

According to some embodiments of the present disclosure, with reference to FIG. 22 and FIG. 23, in another aspect, a photovoltaic module is provided and includes: a plurality of cell strings, each formed by connecting a plurality of solar cells 40 according to any of the above embodiments, at least one encapsulation film for covering surfaces of the plurality of cell strings, at least one cover plate for covering a surfaces of the at least one encapsulation film facing away from the plurality of cell strings.

In some embodiments, the plurality of cell strings may be electrically connected via connection components 409, and the connection components 409 are welded between busbars 264 on the cells.

In some embodiments, no spacing is provided between the cells, i.e., the cells overlap with each other.

In some embodiments, the connection components are welded between fingers on the cells, the fingers include first electrodes 2141 and second electrodes 2142. In some embodiments, the connection components are welded between the busbars 264 on the cells, the busbars include first busbars welded to the first electrodes 2141 and second busbars welded to the second electrodes 2142.

In some embodiments, the at least one encapsulation film includes a first encapsulation film and a second encapsulation film, the first encapsulation film covers one of the front surface and the rear surface of the solar cell, the second encapsulation film covers the other of the front surface and the rear surface of the solar cell. Specifically, at least one of the first encapsulation film and the second encapsulation film may be an organic encapsulation film such as a Polyvinyl Butyral (PVB) film, an ethylene-vinyl acetate copolymer (EVA) film, a polyolefin elastomer (POE) film, or a polyethylene terephthalate (PET) film.

It is worth noting that there is a dividing line between the first encapsulation film and the second encapsulation film before a lamination process, and the photovoltaic module is formed after the lamination process, there is no concept of the first encapsulation film and the second encapsulation film, i.e., the first encapsulation film and the second encapsulation film already form an integral encapsulation film 47.

In some embodiments, the at least one cover plate 48 may be the cover plate having a light transmitting function, such as a glass cover plate, a plastic cover plate. Specifically, the surface of the at least one cover plate 48 facing the encapsulation film 47 may be an uneven surface, thereby increasing the utilization rate of the incident light. The at least one cover plate 48 include a first cover plate and a second cover plate, the first cover plate faces the first encapsulation film, and the second cover plate faces the second encapsulation film; or the first cover plate faces one side of the solar cell and the second cover plate faces the other side of the solar cell.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

A person of ordinary skill in the art may understand that, the foregoing implementations are specific embodiments for implementing the present disclosure. During actual application, various changes may be made to the forms and details without departing from the scope of the embodiments of the present disclosure. Any person skilled in the art may make various variations and modifications without departing from the spirit and scope of the embodiments of the present disclosure. Therefore, the protection scope of the embodiments of the present disclosure should be subject to a scope defined by the appended claims.

What is claimed is:

1. A solar cell, comprising:
   a substrate having a first surface and a second surface opposite to the first surface, wherein a portion of the first surface and the second surface has textured structures;
   a doped semiconductor layer, disposed on the substrate;
   holes extending through at least the doped semiconductor layer, and corresponding, respectively, to the textured structures, and a bottom of a respective hole of the holes exposes at least a portion of a corresponding textured structure of the textured structures;

a passivation layer, formed over a surface of the doped semiconductor layer away from the substrate, wherein the passivation layer fills the holes; and a plurality of electrodes, arranged at intervals along a first direction, passing through the passivation layer and in electrical contact with the doped semiconductor layer, wherein the doped semiconductor layer is doped with doping elements of a same type as the substrate.

2. The solar cell according to claim 1, wherein the textured structures include at least one raised structure, and the respective hole corresponds to 1 to 5 raised structures in the at least one raised structure.

3. The solar cell according to claim 1, wherein the substrate is provided with a pyramidal structure on the first surface, and with the textured structures on a portion of the second surface;

the pyramidal structure includes a plurality of pyramids, the textured structures includes at least one raised structure, and a one-dimensional size of a respective raised structure of the at least one raised structure is less than or equal to a one-dimensional size of a respective pyramid of the plurality of pyramids.

4. The solar cell according to claim 2, wherein the respective raised structure has a one-dimensional size in a range of 1 µm to 20 µm and a height in a range of 1 µm to 20 µm.

5. The solar cell according to claim 3, wherein the substrate is further provided with a truncated pyramid structure on another portion of the second surface, the truncated pyramid structure includes a plurality of truncated pyramids, and a respective truncated pyramid of a portion of the plurality of truncated pyramids is overlapped with a truncated pyramid adjacent to the respective truncated pyramid.

6. The solar cell according to claim 1, wherein the respective hole has a one-dimensional size ranging from 5 µm to 20 µm.

7. The solar cell according to claim 1, wherein the substrate is provided with recesses, the recesses correspond, respectively, to the holes, the textured structures are arranged in the recesses.

8. The solar cell according to claim 7, wherein a respective recess of the recesses has a depth in a range of 0.1 µm to 4 µm.

9. The solar cell according to claim 1, wherein the doped semiconductor layer includes at least one of a doped amorphous silicon layer, a doped polycrystalline silicon layer, a doped microcrystalline silicon layer, a doped silicon carbide layer, and a doped crystalline silicon layer.

10. The solar cell according to claim 1, wherein the doped semiconductor layer has a boundary, a number of the holes near the boundary is greater than a number of the holes away from the boundary.

11. The solar cell according to claim 1, further comprising a dielectric layer between the substrate and the doped semiconductor layer, wherein the holes further extends through the dielectric layer.

12. The solar cell according to claim 1, wherein a portion of the plurality of electrodes are arranged in the holes to cover the textured structures.

13. The solar cell according to claim 3, wherein the substrate is provided with P regions, N regions and gap regions on the second surface, the P regions and the N regions are arranged alternatingly, a respective gap region of the gap regions is sandwiched between a respective P region of the P regions and a N region adjacent to the respective P region in the N regions;

the doped semiconductor layer includes a first portion arranged at the P regions and a second portion arranged at the N regions;

the plurality of electrodes include first electrodes in electrical contact with the first portion of the doped semiconductor layer and second electrodes in electrical contact with the second portion of the doped semiconductor layer;

the passivation layer further covers a surface of the substrate at the gap regions; and a portion of the holes is arranged at the first portion of the doped semiconductor layer, and/or another portion of the holes is arranged at the second portion of the doped semiconductor layer.

14. The solar cell according to claim 13, wherein the gap regions are level with the P regions and the N regions.

15. The solar cell according to claim 13, wherein a respective hole arranged at the first portion of the doped semiconductor layer has a one-dimensional size less than a one-dimensional size of a respective hole at the second portion of the doped semiconductor layer.

16. The solar cell according to claim 1, wherein the textured structures and the holes form a light trapping structure.

17. The solar cell according to claim 12, wherein the plurality of electrodes are in contact with at least one raised structure included in the textured structures.

18. A tandem solar cell, comprising:

a bottom cell, being the solar cell according to claim 1; and a top cell, arranged on a side of the substrate of the bottom cell away from the plurality of electrodes.

19. A photovoltaic module, comprising:

at least one cell string formed by connecting a plurality of solar cells wherein each of the plurality of solar cells is the solar cell according to claim 1;

at least one encapsulation film, formed over surfaces of the at least one cell string;

at least one cover plate, formed over surfaces of the at least one encapsulation film facing away from the at least one cell string.

* * * * *